(12) United States Patent
Ushiku

(10) Patent No.: US 6,930,359 B2
(45) Date of Patent: Aug. 16, 2005

(54) SEMICONDUCTOR DEVICE AND METHOD OF MANUFACTURING THE SAME

(75) Inventor: Yukihiro Ushiku, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/807,303

(22) Filed: Mar. 24, 2004

(65) Prior Publication Data

US 2004/0173851 A1 Sep. 9, 2004

Related U.S. Application Data

(62) Division of application No. 09/713,251, filed on Nov. 16, 2000, now Pat. No. 6,724,045.

(30) Foreign Application Priority Data

Nov. 18, 1999 (JP) .......................................... 11-327916

(51) Int. Cl.[7] .............................................. H01L 27/01
(52) U.S. Cl. ........................ 257/347; 257/349; 257/370; 257/378
(58) Field of Search ................................ 257/347, 349, 257/370, 378

(56) References Cited

U.S. PATENT DOCUMENTS

| | | | |
|---|---|---|---|
| 5,100,810 A | * | 3/1992 | Yoshimi et al. ............. 438/155 |
| 5,102,809 A | | 4/1992 | Eklund et al. |
| 5,212,397 A | | 5/1993 | See et al. |
| 5,258,318 A | | 11/1993 | Buti et al. |
| 5,294,823 A | | 3/1994 | Eklund et al. |
| 5,371,401 A | | 12/1994 | Kurita |
| 5,430,318 A | | 7/1995 | Hsu |
| 5,909,626 A | | 6/1999 | Kobayashi |
| 6,096,584 A | | 8/2000 | Ellis-Monaghan et al. |
| 6,232,649 B1 | | 5/2001 | Lee |
| 6,235,567 B1 | * | 5/2001 | Huang ........................ 438/202 |
| 6,365,447 B1 | * | 4/2002 | Hebert et al. ............... 438/203 |
| 6,555,891 B1 | * | 4/2003 | Furukawa et al. .......... 257/505 |

FOREIGN PATENT DOCUMENTS

| | | |
|---|---|---|
| JP | 3-129765 | 6/1991 |
| JP | 3-142952 | 6/1991 |
| JP | 6-163677 | 6/1994 |
| JP | 8-167646 | 6/1996 |
| JP | 9-135030 | 5/1997 |

OTHER PUBLICATIONS

Chinese Patent Office Action dated Oct. 10, 2003, and English translation thereof.

* cited by examiner

Primary Examiner—B. William Baumeister
Assistant Examiner—Douglas Menz
(74) Attorney, Agent, or Firm—Finnegan, Henderson, Farabow, Garrett & Dunner, LLP

(57) ABSTRACT

In a semiconductor device having a semiconductor element having a plurality of SOI-Si layers, the height of element isolation regions from the surface of the semiconductor substrate are substantially equal to each other. Alternatively, the element isolation regions are formed at the equal height on the semiconductor substrate and then a plurality of SOI-Si layers appropriately different in thickness are formed. In this manner, it is possible to obtain element isolation regions having substantially the same height from the semiconductor substrate and desired element regions having SOI-Si layers different in height. The thickness of a single crystalline silicon film (SOI-Si layer) may be appropriately changed by another method which includes depositing an amorphous silicon film and applying a heat processing to form an epi layer, and removing an unnecessary portion.

4 Claims, 14 Drawing Sheets

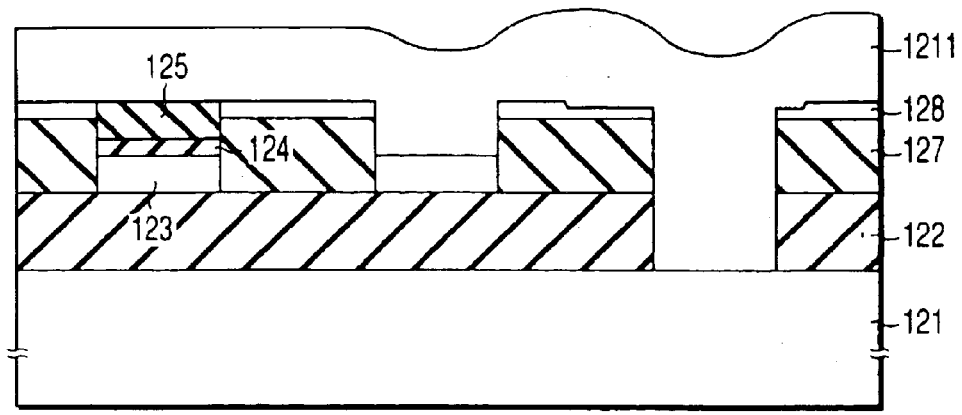
F I G. 17A
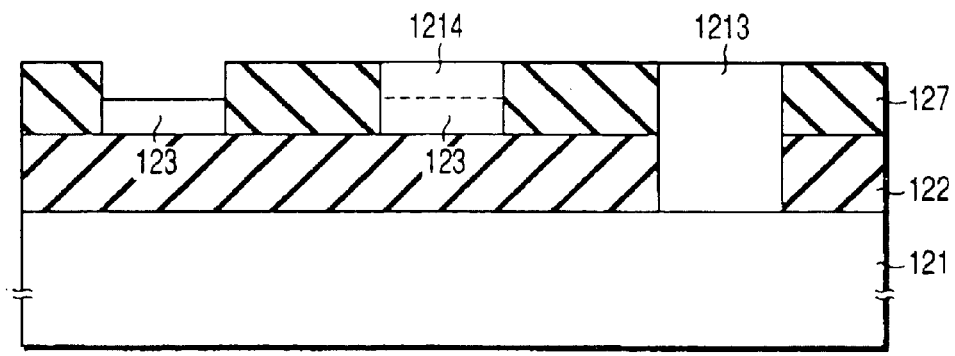
F I G. 17B
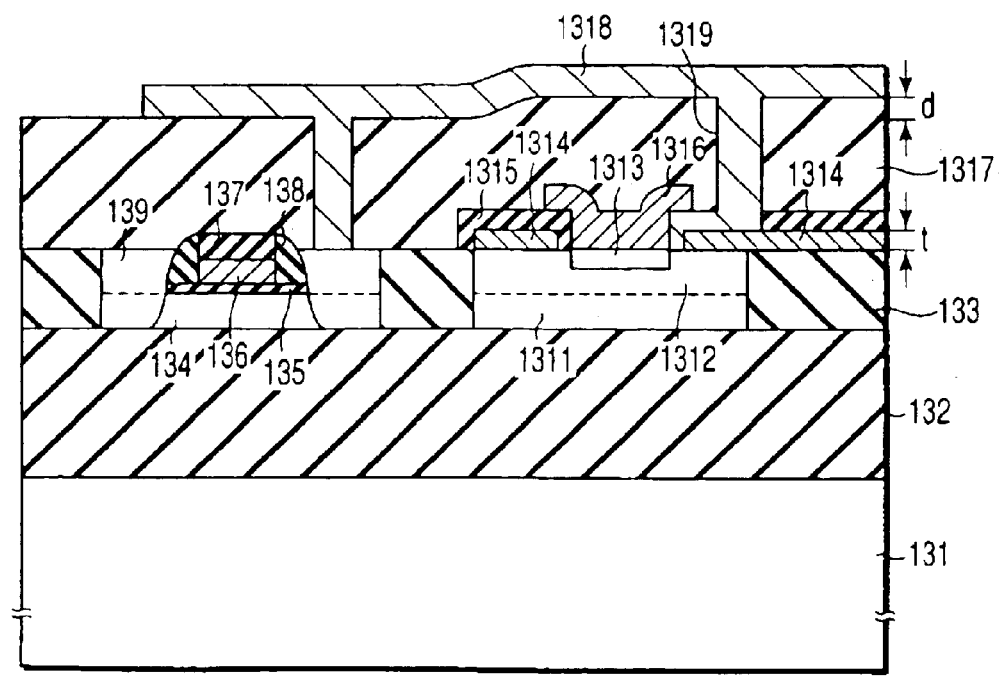
F I G. 18

SEMICONDUCTOR DEVICE AND METHOD OF MANUFACTURING THE SAME

CROSS-REFERENCE TO RELATED APPLICATIONS

This is a division of application Ser. No. 09/713,251, filed Nov. 16, 2000, now U.S. Pat. No. 6,724,045, which is incorporated in its entirety herein by reference. This application is also based upon and claims priority from prior Japanese Patent Application No. 11-327916, filed Nov. 18, 1999, the entire contents of which are incorporated herein by reference.

BACKGROUND OF THE INVENTION

The present invention relates to a semiconductor device in which a plurality of semiconductor elements have a SOI (Silicon On Insulator)-Si layer and a method of manufacturing the same. More particularly, the present invention relates to a structure of an element isolation film and a method of manufacturing the same.

In a conventionally-known semiconductor device, a CMOS element and a bipolar element are integrally formed on a SOI substrate (U.S. Pat. No. 5,212,397). The SOI substrate is constituted of a silicon semiconductor substrate (Si-sub) 1 and a buried oxide film (BOX) 2 formed thereon, as shown in FIG. 23. The buried oxide film 2 is formed by doping oxygen ions into the semiconductor substrate. The SOI substrate has a bipolar region 9 and a CMOS region 10. CMOS elements 7 and 8 are formed in the CMOS region 10, whereas a bipolar element is formed in the bipolar region 9. More specifically, the CMOS elements 7 and 8 are formed in a thin single crystalline silicon layer 3 formed on the buried oxide film (BOX) 2 within the CMOS region 10. The buried oxide film (BOX) 2 is deeply etched within the bipolar region 9. Within the etched region of the buried oxide film (BOX) 2, a thick single crystalline silicon layer 4 is formed by epitaxial deposition. A semiconductor element (bipolar element) is formed in the single crystalline layer 4. Although only a single bipolar element is shown in the figure, bipolar elements are separated by an element isolation silicon oxide film 6 formed in the element isolation region. On the other hand, the CMOS elements 7 and 8 are separated by an element isolation silicon oxide film 5 in the element isolation region. The element isolation film 6 of the bipolar region 9 is formed thicker than the element isolation film 5 of the CMOS region 10 and therefore the height of the film 6 from the surface of the substrate is larger than that of the film 5. To explain more specifically, the element isolation film 6 of the bipolar region 9 differs in thickness from the element isolation film 5 of the CMOS region 10, and therefore, their heights from the surface of the substrate differ.

A bipolar transistor has an emitter, base, collector, and collector extraction layer which are formed in the single crystalline silicon layer 4 of the bipolar region 9, and an emitter electrode, base electrode, and a collector electrode which are formed on the single crystalline silicon layer 4. A PMOS transistor of a CMOS transistor structure has a P+ source/drain region formed in the single crystalline silicon layer 3 of the CMOS region, a gate oxide film formed on the single crystalline silicon layer 3, and a gate electrode 7 formed on the gate oxide film. An NMOS transistor of the CMOS transistor structure has an N+ source/drain region formed in the single crystalline silicon layer 3 of the CMOS region, a gate oxide film formed on the single crystalline silicon layer 3, and a gate electrode 8 formed on the gate oxide film.

As described in the above, in the conventional semiconductor device, the element isolation film 6 of the bipolar region 9 is formed thicker than the element isolation film 5 of the CMOS region 10. Thus, the height of the element isolation film 6 from the surface of the substrate is larger than the element isolation film 5. In other words, since the thickness of the element isolation film 6 of the bipolar region differs in thickness from the element isolation film 5 of the CMOS region 10, their heights from the surface of the substrate differ from each other. This makes it difficult to process a wiring layer formed over the bipolar region 9 and the CMOS region 10. More specifically, in the manufacturing process of a semiconductor device having a plurality of SOI-Si layers different in thickness on a single SOI substrate; since element isolation is performed after a plurality of SOI-Si layers different in thickness are formed, the heights of the insulating films of the element isolation region differ. Therefore, it is difficult to process a wiring layer in a wiring formation step performed later. Furthermore, as a result of the insulating films of the element isolation region differing in height, "out-of-focus" occurs in a lithography step later performed, rendering it difficult to perform a micro gate processing.

There is another publication (U.S. Pat. No. 5,294,823) besides the aforementioned publication (U.S. Pat. No. 5,212,397) in which a plurality of single crystalline semiconductor layers different in thickness which are formed on a buried insulating film, are integrally formed into a single chip. However, in this conventional example, the element isolation regions of the bipolar region and the CMOS region 10 differ in height from the surface of a semiconductor substrate. Therefore, the same problems as in U.S. Pat. No. 5,212,397 resides also in U.S. Pat. No. 5,294,823.

BRIEF SUMMARY OF THE INVENTION

The present invention has been made under the aforementioned problems. An object of the present invention is to provide a semiconductor device and a method of manufacturing the semiconductor device in which the insulating films of the element isolation region in a bipolar region have substantially the same height as that in the CMOS region, enabling micro wiring processing easier.

The present invention is directed to a semiconductor device having a plurality of semiconductor elements having a SOI-Si layer, which is characterized in that the element isolation films of a plurality of semiconductor elements have the substantially the same height from the surface of the semiconductor substrate, that is, the surfaces of the element isolation films form substantially the same plane. Furthermore, the present invention is characterized in that after element isolation regions are formed so as to form the same plane having the same height from the surface of the semiconductor substrate a plurality of SOI-Si films (single crystalline silicon film) different in thickness are formed.

According to the present invention, element isolation insulating films have substantially the same height from a semiconductor substrate. Therefore, wiring processing can be performed easier. Furthermore, according to the present invention, it is possible to manufacture a semiconductor device having a plurality of semiconductor elements having SOI-Si layers different in thickness without increasing the number of steps.

In a first aspect of the present invention, there is provided a semiconductor device comprising: a semiconductor substrate; a buried insulating film formed on the semiconductor substrate; a plurality of single crystalline semiconductor layers, each having a semiconductor element formed therein and being formed on the buried insulating film; and an element isolation region formed between adjacent single crystalline semiconductor layers, the element isolation insulating films formed in the element isolation region and having substantially the same height from the surface of the semiconductor substrate.

In the semiconductor device according to the first aspect of the present invention, at least one of the plurality of single crystalline semiconductor layers may differ in thickness from other single crystalline semiconductor layers. In the semiconductor device, the single crystalline semiconductor layers may include a first single crystalline semiconductor layer having a MOS transistor formed therein and a second single crystalline semiconductor layer having a bipolar transistor formed therein, the first and second single crystalline semiconductor layers having substantially the same film thickness and a thickness of the semiconductor layer lower than the gate electrode of the MOS transistor being lower than the film thickness of the second single crystalline semiconductor layer. In the semiconductor device, in the single crystalline semiconductor layers, a full depletion element and a partially Depletion element may be formed.

In the semiconductor device according to the first aspect of the present invention, the single crystalline semiconductor layers may include a first single crystalline semiconductor layer having a MOS transistor formed therein and a second single crystalline semiconductor layer having a bipolar transistor formed therein, the first and second single crystalline semiconductor layers having substantially the same film thickness and a thickness of the semiconductor layer lower than the gate electrode of the MOS transistor being lower than the film thickness of the second single crystalline semiconductor layer. In the semiconductor device, in the single crystalline semiconductor layers, a full depletion element and a partially Depletion element may be formed.

In the semiconductor device according to the first aspect of the present invention, in the single crystalline semiconductor layers, a full depletion element and a partially Depletion element may be formed.

In a second aspect of the present invention, there is provided a semiconductor device comprising: a semiconductor substrate having a first region and a second region; a buried insulating film formed in the first region of the semiconductor substrate; at least one first single crystalline semiconductor layer having a semiconductor element formed therein and formed in the buried insulating film and; at least one second single crystalline semiconductor layer formed in the second region and in contact with the semiconductor substrate; and an element isolation region for isolating the single crystalline semiconductor layers from each other, wherein all the element isolation insulating films in the element isolation region have the same height from the semiconductor substrate.

In the semiconductor device according to the second aspect of the present invention, the first single crystalline semiconductor layer formed in the first region may consist of a plurality of semiconductor layers having a plurality of film thicknesses. In the semiconductor device, a CMOS element may be formed in the first region and a bipolar element may be formed in the second region. In the semiconductor device, a MOS transistor may be formed in a predetermined first single crystalline semiconductor layer of the first region; a bipolar transistor may be formed in a predetermined second single crystalline semiconductor layer of the second region; the first and second single crystalline semiconductor layers have substantially the same height from the surface of the semiconductor substrate; and the thickness of the semiconductor layer lower than the gate electrode of the MOS transistor is substantially the same as the thickness of a predetermined second single crystalline semiconductor layer.

In the semiconductor device according to the second aspect of the present invention, a CMOS element may be formed in the first region and a bipolar element may be formed in the second region. In the semiconductor device, a MOS transistor may be formed in a predetermined first single crystalline semiconductor layer of the first region; a bipolar transistor may be formed in a predetermined second single crystalline semiconductor layer of the second region; the first and second single crystalline semiconductor layers have substantially the same height from the surface of the semiconductor substrate; and the thickness of the semiconductor layer lower than the gate electrode of the MOS transistor is substantially the same as the thickness of a predetermined second single crystalline semiconductor layer.

In the semiconductor device according to the second aspect of the present invention, a MOS transistor may formed in a predetermined first single crystalline semiconductor layer of the first region; a bipolar transistor may formed in a predetermined second single crystalline semiconductor layer of the second region; the first and second single crystalline semiconductor layers have substantially the same height from the surface of the semiconductor substrate; and the thickness of the semiconductor layer lower than the gate electrode of the MOS transistor is substantially the same as the thickness of a predetermined second single crystalline semiconductor layer.

In a third aspect of the present invention, there is provided a method of manufacturing a semiconductor device comprising the steps of: forming a semiconductor substrate by laminating a buried insulating film, a single crystalline semiconductor layer, a first insulating film subsequently in this order; etching the first insulating film and the single crystalline semiconductor layer to form a plurality of laminate films consisting of the single crystalline semiconductor layer and the first insulating film in the buried insulating film; forming a second insulating film on the semiconductor substrate so as to cover the laminate films; flattening the second insulating film until the height of the second insulating film from the semiconductor substrate becomes the same as that of the first insulating film, thereby forming an element isolation region; etching away the first insulating film constituting at least one laminate film to expose a surface of the single crystalline semiconductor layer under the first insulating film; and depositing the single crystalline semiconductor to a predetermined depth on the exposed single crystalline semiconductor layer.

In a fourth aspect of the present invention, there is provided a method of manufacturing a semiconductor device comprising the steps of: forming a semiconductor substrate by laminating a buried insulating film, a single crystalline semiconductor element, a first insulating film subsequently in this order; etching the first insulating film and the single crystalline semiconductor layer to form a plurality of laminate films consisting of the single crystalline semiconductor layer and the first insulating film on the buried insulating film; forming a second insulating film on the semiconductor substrate so as to cover the laminate films; flattening the second insulating film until the height of the second insulating film becomes substantially the same as that of the first insulating film to from an element isolation region; etching away at least one laminate film and simultaneously etching away the buried insulating film under the removed laminate film, thereby exposing a surface of the semiconductor substrate; etching the first insulating film constituting at least one laminate film excluding the removed laminate film, thereby exposing a surface of the single crystalline semiconductor layer under the first insulating film; and depositing a single crystalline semiconductor on the exposed single crystal semiconductor layer to thicken the single crystalline semiconductor layer, and simultaneously forming a single crystalline semiconductor layer on an exposed surface of the semiconductor substrate, thicker than the single crystalline semiconductor layer formed on the buried insulating film.

In a fifth aspect of the present invention, there is provided a method of manufacturing a semiconductor device comprising the steps of: forming a semiconductor substrate by laminating a buried insulating film, a single crystalline semiconductor layer, a first insulating film subsequently in this order; etching the first insulating film and the single crystalline semiconductor layer to form a plurality of laminate films consisting of the single crystalline semiconductor layer and the first insulating film on the buried insulating film; forming a second insulating film on the semiconductor substrate so as to cover the laminate films; flattening the second insulating film until the height of the second insulating film from the semiconductor surface becomes substantially the same as that of the first insulating film to from an element isolation region; etching away the first insulating film constituting at least one laminate film to expose a surface of the single crystalline semiconductor layer under the first insulating film; forming a MOS transistor on the single crystalline semiconductor layer whose surface is exposed; etching away the first insulating film formed on a predetermined single crystalline semiconductor layer within the single crystalline semiconductor layer covered with the first insulating film; depositing a single crystalline semiconductor on the single crystalline semiconductor layer having the MOS transistor formed therein and on the single crystal semiconductor layer whose surface is exposed; and forming a bipolar transistor on a predetermined single crystalline semiconductor layer whose surface is exposed.

In a sixth aspect of the present invention, there is provided a method of manufacturing a semiconductor device comprising the steps of: forming a semiconductor substrate by laminating a buried insulating film, a single crystalline semiconductor layer, and a first insulating film subsequently; etching the first insulating film and the single crystalline semiconductor layer to form a plurality of laminate films consisting of the single crystalline semiconductor layer and the first insulating film on the buried insulating film; forming a second insulating film on the semiconductor substrate so as to cover the laminate films; flattening the second insulating film until the height of the second insulating film from the semiconductor surface becomes substantially the same as that of the first insulating film to from an element isolation region; etching away at least one laminate film and simultaneously etching away the buried insulating film under the removed laminate film to expose a surface of the underlying semiconductor substrate; depositing the single crystalline semiconductor layer in contact with the surface of the exposed semiconductor substrate; etching away the first insulating film constituting at least one laminate film excluding the removed laminate film to expose a surface of the single crystalline semiconductor surface; forming a MOS transistor on the exposed single crystalline semiconductor layer; depositing a single crystalline semiconductor on the single crystalline semiconductor layer having the MOS transistor formed therein and simultaneously depositing on the single crystal semiconductor layer formed on the semiconductor substrate whose surface is exposed, thereby rendering the height of the single crystalline semiconductor layer having the MOS transistor therein, from the surface of the semiconductor substrate, substantially the same as that of the single crystalline semiconductor layer formed on the semiconductor substrate whose surface is exposed; and depositing the single crystalline semiconductor and forming a bipolar transistor on the single crystalline semiconductor layer formed on the semiconductor substrate whose surface is exposed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 17A and 17B are cross-sectional views of a semiconductor device of the present invention, showing manufacturing steps;

FIG. 18 is a cross-sectional view of a semiconductor device according to the present invention;

DETAILED DESCRIPTION OF THE INVENTION

Now, various embodiments of the present invention will be explained with reference to the accompanying drawing.

Figure 1:
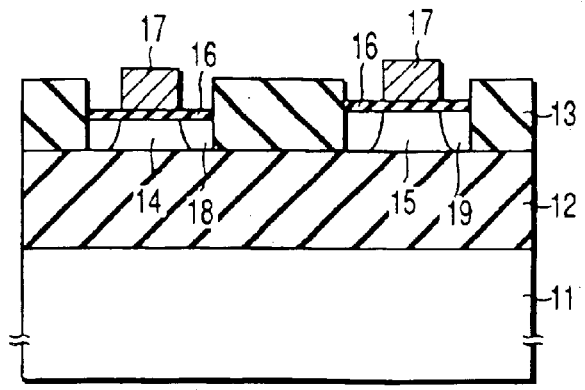
FIG. 1 is a cross-sectional view of a semiconductor device according to the present invention.

In the first place, a first embodiment will be explained with reference to FIG. 1. FIG. 1 is a cross-sectional view of a semiconductor device having a plurality of single crystalline semiconductor layers different in thickness.

On a silicon semiconductor substrate 11, a buried insulating film 12 of 500 nm thick is formed which is, for example, made of a silicon oxide. On this structure, single crystalline silicon layers 14, 15 are formed. The film thickness of the single crystalline silicon layer 14 is, for example, 50 nm. The film thickness of the single crystalline silicon layer 15 is, for example, 100 nm. These single crystalline silicon layers 14, 15 are isolated by an element isolation insulating film 13 (made of e.g., silicon oxide film of abut 120 nm) of an element isolation. On these single crystalline silicon layers 14, 15, a gate electrode 17 of impurity-doped polysilicon is formed with a gate insulating film 16 (such as silicon oxide film of e.g., 6 nm thick 9 interposed between them. Furthermore, impurity diffusion regions 18, 19 serving as source and drain regions are formed, respectively in the single crystalline silicon layers 14, 15. In FIG. 1, both of the gate insulating films on the single crystalline layers 14, 15 have the same thickness of 6 nm. However, they may differ in thickness. If so, elements can be formed individually with the most desirable designs.

FIG. 1 only shows a transistor structure without a wiring structure. Usually, an LDD structure is employed in a miniaturized MOS transistor. In FIG. 1, a gate side wall insulating film and the impurity diffusion region are not shown herein and the LDD structure is also omitted. As a gate electrode structure, various structures may be employed including a gate electrode structure formed of polysilicon/metal (silicide), a gate electrode structure having an insulating film deposited further thereon, and a gate electrode formed of a metal. However, the structure of the gate electrode is also not shown. Furthermore, other structures, that is, an impurity doped structure such as a well, formed in the semiconductor substrate are not shown. The explanation just as in the case of FIG. 1 will be made as to figures which will be explained later.

The feature of the present invention resides in that although a plurality of semiconductor elements having single crystalline silicon layers different in thickness, are formed on the same semiconductor substrate, the insulating films of element isolating regions have the same thicknesses. More specifically, since the height of the insulating films from the surface of the substrate are equal, processing can be made easily at the time the wiring layer is formed.

For example, if an FD (full depletion) element is formed in the thin single crystalline silicon layer 14 and a PD (partial depletion) element is formed in a thick single crystalline silicon layer 15, it is possible to form transistors different in threshold value on the same SOI substrate. More specifically, a semiconductor element having a threshold of 0.2V can be formed in the single crystalline silicon layer 14 and a semiconductor element having a threshold of 0.4V in the single crystalline silicon layer 15. Therefore, if the circuit which has to be operated with a low power consumption by reducing a power source voltage to about 1.2V, is formed in the single crystalline silicon layer 14, and the circuit which is operated at a high speed by increasing the power source voltage to 3.3V, is formed in the single crystalline silicon layer 15, it is possible to manufacture a high-speed semiconductor device with a power consumption lower than a conventional semiconductor device. The advantages of the semiconductor device of this type is due to the structure in which the FD element which is low in threshold voltage, excellent in cut-off characteristics, that is, low in leak current, and the PD element excellent in power-source resistance are formed in the same SOI substrate.

If the present invention is used, a circuit formed of the PD element having a polysilicon gate (gate length: 0.25 $\mu$m, SOI film thickness: 80 nm, an impurity concentration: $7\times10^{17}$ cm$^{-3}$) and a circuit formed of the FD element having a metal gate (SOI film thickness: 30 nm, impurity concentration: $1\times10^{17}$ cm$^{-3}$) are easily formed on the same semiconductor substrate without changing a circuit design.

In the next step, if two types of SOI films of 100 $\mu$m and 50 $\mu$m thick are further formed with an impurity concentration of $5\times10^{17}$ cm$^{-3}$ and a PD/FD element is formed of a polysilicon gate, the step of changing an impurity concentration can be eliminated.

It is therefore possible to easily form a circuit different in design by using the present invention.

Furthermore, if an NMOS element is formed in the thin single crystalline silicon layer 14 and a PMOS element is formed in the thick single crystalline silicon layer 15, it is possible to realize a CMOS circuit while preventing kink characteristics of the NMOS element. In this case, both the NMOS element and the PMOS element may be formed of the PD element.

Furthermore, a MOS transistor and a bipolar transistor may be integrated in the same SOI substrate.

Figure 2:
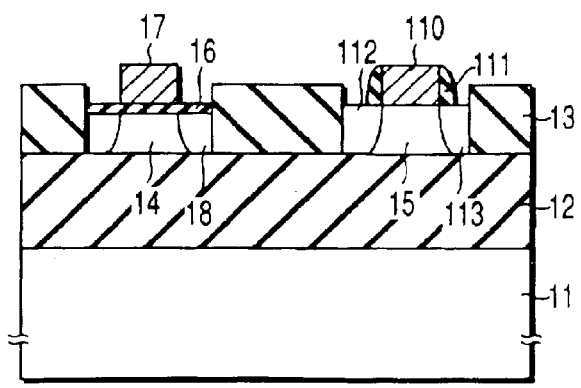
FIG. 2 is a cross-sectional view of a semiconductor device according to the present invention.

FIG. 2, which is a modified example of the first embodiment shown in FIG. 1, shows a cross-sectional view of a semiconductor device having a plurality of single crystalline semiconductor layers different in thickness.

Now, the semiconductor device shown in FIG. 2 will be explained. On a silicon semiconductor substrate 11, a buried insulating film 12 is formed which is a silicon oxide film of, e.g., 500 nm thick. On the buried insulating film 12, single crystalline silicon layer 14, 15 are formed, which are isolated by an element isolation insulating film 13 of, e.g., 120 nm thick. The single crystalline silicon layers 14, 15 are 50 nm and 100 nm in thickness, respectively. On the single crystalline silicon layer 14, a impurity-doped polysilicon gate electrode 17 is formed with a gate insulating film 16 of e.g., 6 nm thick interposed between them. In the single crystalline silicon layer 14, an impurity diffusion region 18 serving as a source/drain region is formed. On the other hand, a base electrode 110 formed of polysilicon doped with impurity is formed on the single crystalline silicon layer 15. At the side of the base electrode 110, a side-wall insulating film 111 is formed. In the single crystalline silicon layer 15, impurity diffusion regions 112, 113 serving as an emitter region and a collector region are formed, respectively. Wiring layers are omitted herein in the same as in FIG. 1.

In the case of FIG. 2, even if the elements having silicon layers different in thickness are formed on the same substrate, the insulating films of the element isolation regions are almost the same in thickness. More specifically, since the heights of the insulating films from the surface are equal, processing can be made easily in a wiring formation step performed later.

As an application example of the semiconductor device of this type, a MOS transistor, which is an FD (full depletion) element or a PD (partial depletion) element, is formed in thin single crystalline silicon layer 14 and a lateral bipolar element is formed in the thick single crystalline silicon layer 15. If the circuit which has to be operated with a low power consumption, is formed in the single crystalline silicon layer 14, and the bipolar element requiring high frequency characteristics is formed in the single crystalline silicon layer 15, it is possible to manufacture a high-speed semiconductor device which can be operated with a power consumption lower than a conventional semiconductor device. This is because if a MOSFET is formed in the thin single crystalline silicon layer (SOI-Si layer), a semiconductor element having a low threshold voltage and excellent cut-off characteristics is obtained, whereas if the bipolar element is formed in the thick single crystalline silicon layer (SOI-Si) layer, a bipolar element excellent in high-frequency characteristics is obtained.

Figure 25:
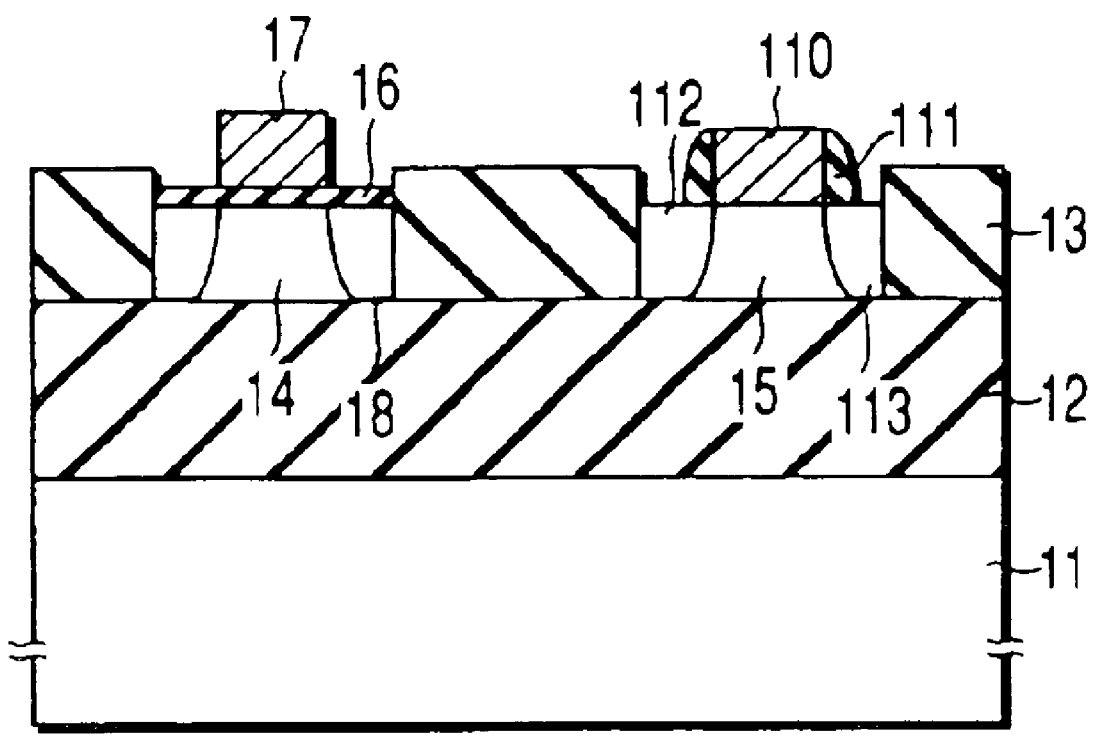
FIG. 25 is a cross-sectional view of a semiconductor device according to the present invention.

FIG. 25 is a cross-sectional view of a semiconductor device according to the present invention.

In the semiconductor device shown in FIG. 25, single crystalline silicon layers 14, 15 have substantially the same thickness, e.g., 100 nm. Other portions or parts are identical with those of the semiconductor device shown in FIG. 2, and the description is omitted. In this case, it may be unavoidable that the power consumption is increased and the operation speed is lowered as compared with the semiconductor device shown in FIG. 2.

Now, a second embodiment will be explained with reference to FIG. 3.

Figure 3:
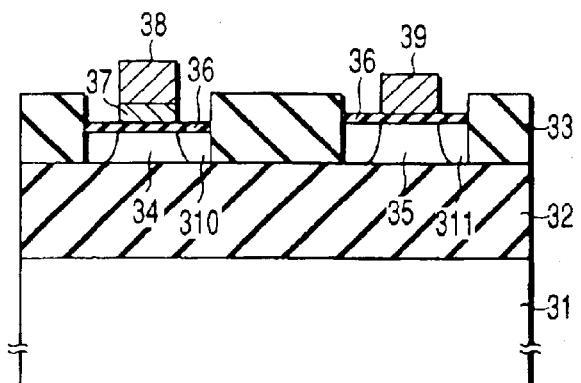
FIG. 3 is a cross-sectional view of a semiconductor device according to the present invention.

FIG. 3 is a cross-sectional view of a semiconductor device having a plurality of single crystalline semiconductor layers different in thickness.

On a silicon semiconductor substrate 31, a buried insulating film 32 such as a silicon oxide film of, e.g., 500 nm thick is formed. On the buried insulating film 32, single crystalline layers 34, 35 are formed which are isolated by an element isolation insulating film 33 of 120 nm thick. The single crystalline silicon layers 34, 35 are 50 nm and 100 nm in thickness, respectively. Laminate gate electrode 37, 38 and a gate electrode 39 doped with impurities are formed on the single crystalline silicon layers 34, 35 with a gate insulating film 36 of e.g., 6 nm thick interposed between them. More specifically, a polysilicon electrode layer 37 of, e.g., 50 nm thick and a polysilicon electrode layer 38 of e.g., 200 nm thick are laminated on the single crystalline silicon layer 34. On the single crystalline silicon layer 35, a polysilicon electrode 39 of e.g., 200 nm thick is formed.

Note that, the polysilicon laminate gate electrodes 37 and 38 are not necessarily laminated and may be formed of a polysilicon single layer having a film thickness of about 250 nm. Furthermore, the single crystalline silicon layers 34, 35 may have impurity diffusion regions 310, 311 formed therein, which serve as source and drain regions.

FIG. 3 shows only a transistor structure without the wiring layer structure in the same as in FIGS. 1 and 2.

As explained in the foregoing, even though the semiconductor elements having different single crystalline silicon layers are formed on the same SOI substrate, the insulating films of the element isolation regions have the same thickness in this embodiment. Since the heights of the insulating films from the substrate are equal, processing can be made easily in a wiring formation step performed later. In addition, the heights of the polysilicon gate electrodes from the surface of the substrate are equal. Since the heights of the polysilicon electrodes from the surface of the substrate are equal, the thin single crystalline silicon layer 34 and the thick single crystalline silicon layer 35 have the same depth of focus in a lithographic step for the gate electrode requiring the microprocessing of the highest level. Therefore, the more miniaturized and more accurate processing can be performed.

The same semiconductor elements formed on the thin single crystalline silicon layer 34 and the thick single crystalline silicon layer 35 are the same as in the first embodiment.

Figure 4:
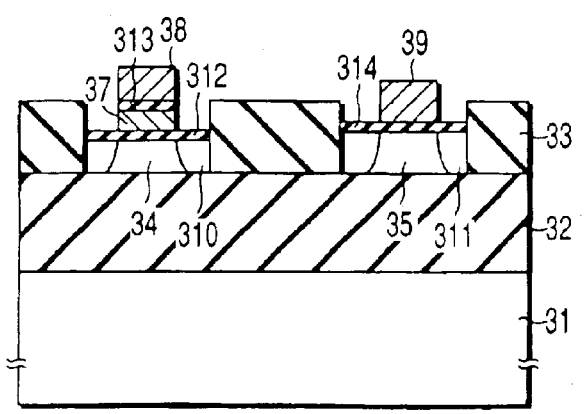
FIG. 4 is a cross-sectional view of a semiconductor device according to the present invention.

FIG. 4 is a modified example of the second embodiment shown in FIG. 3, showing a cross-sectional view of a semiconductor device having a plurality of single crystalline semiconductor layers different in thickness.

The semiconductor device shown in FIG. 4 has a plurality of single crystalline silicon layers different in thickness, as the same as in FIG. 3. The semiconductor device is characterized in that a two-layered gate electrode is formed on the single crystalline silicon layer 34 with an insulating film interposed between them. More specifically, on the single crystalline silicon layer 34, a tunnel oxide film 312 such as a nitrogen-containing silicon oxide film of 8 nm thick is formed. On the tunnel oxide film 312, a polysilicon floating gate electrode 37 serving as a first gate electrode, an interlayer insulating film 313 of polysilicon oxide film of 12 nm thick, and a polysilicon control gate electrode 38 serving as a second gate electrode, are laminated. On the other hand, on the single crystalline silicon layer 35, a gate insulating film 314 such as a silicon oxide film and a gate electrode 39 such as polysilicon are formed.

The interlayer insulating film 313 and the gate insulating film formed of silicon oxide film are formed simultaneously. Similarly, the second gate electrode 38 and the gate electrode 39 are formed simultaneously.

As described in the above, in this embodiment, it is possible to form a non-volatile memory cell on the thin single crystalline silicon layer 34 and form a logic circuit on the thick single crystalline silicon layer 35. In this case, the same advantages as in FIG. 3 can be obtained.

Now, a third embodiment will be explained with reference to FIG. 5.

Figure 5:
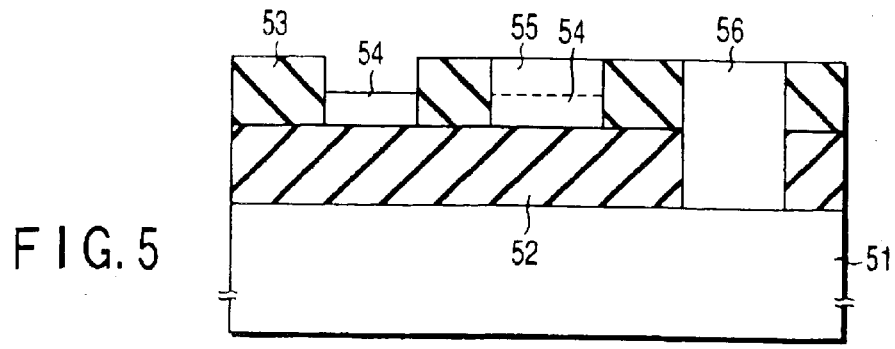
FIG. 5 is a cross-sectional view of a semiconductor device according to the present invention.

FIG. 5 is a cross-sectional view of a semiconductor device having a plurality of single crystalline semiconductor layers different in thickness. FIG. 5 shows the features of the present invention including a buried insulating film, an element isolation insulating film (element isolation region), and the structure of the surface of the single crystalline silicon layer on which a semiconductor element is to be formed; however, a gate electrode and the shape of a impurity diffusion region are not shown.

In FIG. 5, on a silicon semiconductor substrate 51, a buried insulating film 52 such as a silicon oxide film of e.g., 500 nm, is formed. On the buried insulating film 52, single crystalline silicon layers 54, 55 are formed, which are isolated by element isolation insulating films 53 of e.g., 120 nm thick. These single crystalline silicon layers 54, 55 are 50 nm and 100 nm in thickness, respectively. Furthermore, a part of the buried insulating film 52 is removed by etching using the element isolation insulating film 53 as a mask. The surface of the silicon semiconductor substrate 51 is exposed in this part. The silicon semiconductor substrate 51 is joined to the single crystalline silicon layer 56 so as to form a indiscrete silicon crystal in this part.

The element isolation insulating films 53 maintain almost the same height from the surface of the substrate over the entire semiconductor substrate. The single crystalline silicon layers 54, 55 and 56 have almost the same height. Since the number of processing errors due to "out of focus" decreases, microprocessing can be easily performed in a lithographic step for isolating elements and processing a gate. Furthermore, since the wiring layer formed in a later step has a stepped portion having a small difference in height, fine processing of the wiring can be performed easily. As a result, it is possible to prevent breakage of the wiring and occurrence of defects such as short-circuit, improving the yield of the semiconductor device.

In this embodiment, three types of semiconductor elements can be integrated. More specifically, a thin SOI thin-film element, a medium-thick SOI thin-film element, and a bulk element can be integrated on a single SOI substrate. The semiconductor device of this embodiment differs from those shown in FIG. 1 to FIG. 4 in that the bulk element can be integrated.

Thin SOI thin-film element and the medium thick SOI thin-film element can be integrated in the same manner as in FIG. 1 to FIG. 4. The advantages obtained by integrating the bulk element with the SOI elements on the same SOI substrate are as follow: A memory element such as DRAM (the fluctuation of a substrate voltage is desirably low and a threshold voltage is relatively high), a vertical bipolar element in which current flows relatively to the depth of a silicon semiconductor substrate, an nMOS transistor which easily causes deterioration of characteristics due to impact-ionization such as kink, high breakdown voltage semiconductor element which is used in a region to which a relatively high power voltage is applied, and an analog element which requires the linearity of the element characteristics, are formed in a bulk silicon. In addition, these semiconductor elements can be formed on the same SOI substrate.

Now, a fourth embodiment will be explained with reference to FIGS. 6A, 6B, and 6C and FIGS. 7A and 7B.

FIGS. 6A, 6B, and 6C and FIGS. 7A and 7B are cross-sectional views showing manufacturing steps of a semiconductor device (shown in FIG. 1) having a plurality of single crystalline semiconductor layers different in thickness.

Figure 6A:
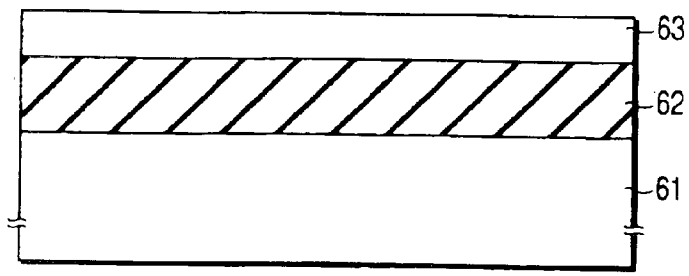
FIGS. 6A, 6B, and 6C are cross-sectional views of a semiconductor device of the present invention, showing manufacturing steps.
Figure 6B:
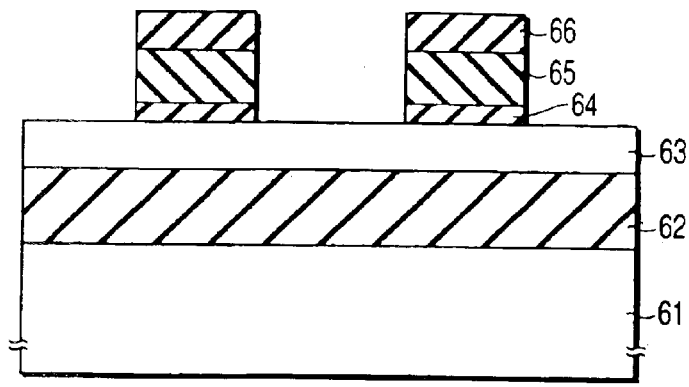

In the first place, on the silicon semiconductor substrate 61, a buried insulating film 62 formed of a silicon oxide film of 500 nm thick and a single crystalline silicon layer 63 of 50 nm thick are laminated in this order to form a SOI substrate (FIG. 6A). Subsequently, the surface of the single crystalline silicon layer 63 is oxidized by heating the semiconductor substrate 61 at 900° C. in an oxygen atmosphere. As a result, a gate insulating film 64 formed of a silicon oxide film of 6 nm thick, is obtained. Subsequently, a silicon nitride film (SiN) 65 of about 150 nm thick is deposited on the resultant structure by an LPCVD (low Pressure Chemical Vapor Deposition) method. Thereafter, a silicon oxide film (SiO$_2$) 66 of about 100 nm thick is deposited by a CVD method. If necessary, a heat treatment is applied to the silicon oxide film 66 to densify and cure it. After that, photoresist is allowed to remain only in the element formation region by a photolithographic method. Using the photoresist as a mask, a laminate body consisting of the silicon oxide film 66, the silicon nitride film 65, and the gate insulating film, is patterned by a RIE method, followed by removing the photoresist. Subsequently, using the silicon oxide film 66 as a mask, the single crystalline silicon layer 63 is etched by a RIE method (FIG. 6B). Thereafter, an oxidation treatment is applied to the surface of the semiconductor substrate (not shown in the figure).

Figure 6C:
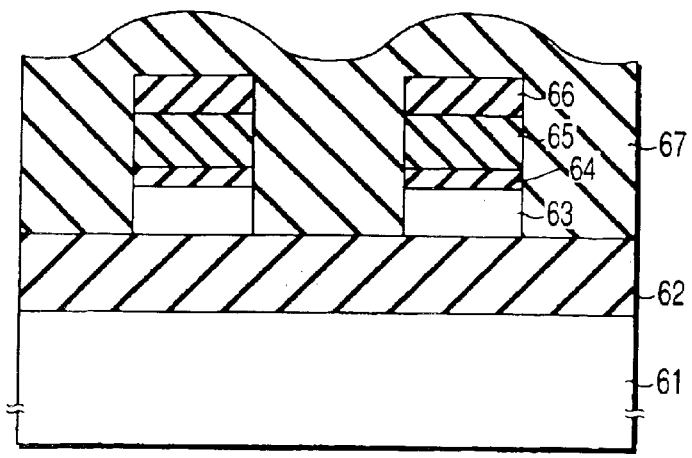
Figure 7A:
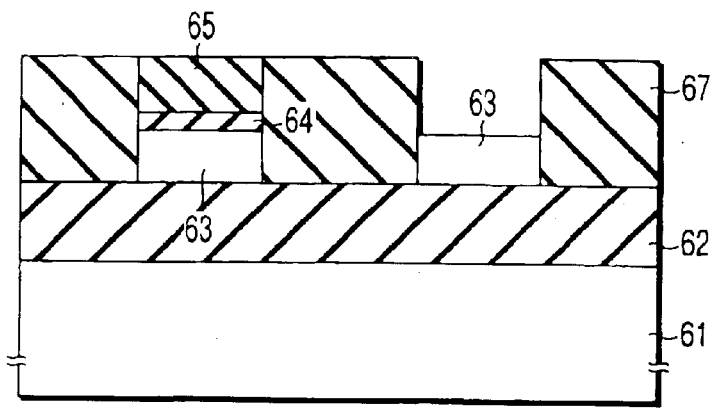
FIGS. 7A and 7B are cross-sectional views of a semiconductor device of the present invention, showing manufacturing steps.

Then, a silicon oxide film 67 of 500 nm thick is deposited by an LPCVD method (FIG. 6C). Thereafter, the silicon oxide films 66, 67 are polished by the CMP method to remove the silicon oxide film 66 until the surface of the silicon oxide film 67 and the surface of the silicon nitride film 65 are in the same plane. At this time, the surface of the silicon nitride film 65 may be slightly removed. In the element isolation region, a silicon oxide film of about 120 nm thick is formed as the element isolation insulating film 67 almost uniformly over the entire surface of the substrate by a CMP processing. Thereafter, a photolithographic step is performed. A patterned photoresist is formed having an opening only at a portion at which the single crystalline silicon layer 63 is to be formed thick. Using the patterned photoresist as a mask, the silicon nitride film 65 is etched with hot phosphoric acid and the silicon oxide film (gate insulating film) 64 is etched away with hydrofluoric acid. After that, the photoresist is removed to allow part of the surface of the single crystalline silicon layer 63 to expose (FIG. 7A).

Subsequently, a single crystalline silicon layer, 68 of about 50 nm thick is selectively deposited on the exposed surface of the single crystalline silicon layer 63, by the LPCVD method. Then, the silicon nitride film 65 is etched away with hot phosphoric acid, and then, the insulating film 64 formed of a silicon oxide film is etched away with diluted hydrofluoric acid (FIG. 7B).

Figure 7B:
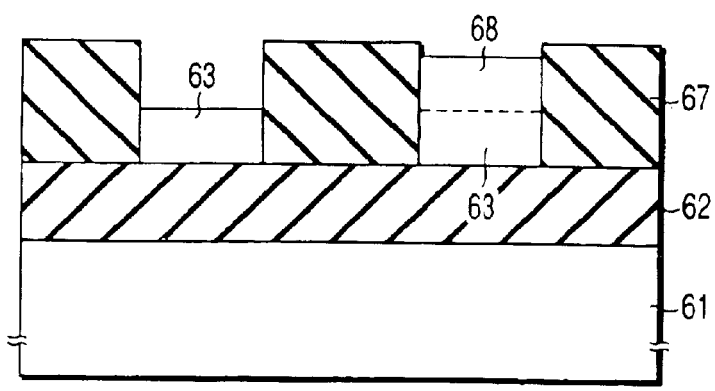

In this embodiment, it is possible to attain a semiconductor device according to the present invention, having single crystalline silicon layers different in thickness formed on the same SOI substrate and having insulating films of the element isolation regions equal in thickness (as shown in FIG. 7B). After that, if the SOI substrate is processed as shown in FIG. 7B, followed by performing generally CMOS manufacturing steps, it is possible to form a semiconductor device shown in FIG. 1. Furthermore, if a CMOS step and a lateral bipolar step are applied to the resultant structure, the semiconductor device shown in FIG. 2 can be obtained.

The method of forming single crystalline silicon layers different in thickness can be modified in various ways. In the aforementioned manufacturing method, the single crystalline silicon layer having a desired thickness can be obtained by using a selective silicon epitaxial deposition method. However, the same structure may be obtained by epitaxially growing silicon to a thickness higher than the thickness of the element isolation insulating film 67 to overfill silicon and removing the single crystalline silicon from an unnecessary portion by a CMP technique. The advantages of this case are: the thickness of the silicon layer can be easily controlled; and a problem of a facet which tends to occur during the epitaxial deposition can be overcome.

As a method as effective as the aforementioned method, the method may be employed which includes depositing amorphous silicon over the entire surface of the substrate, annealing the resultant structure to allow solid-phase growth using a part in contact with the single silicon layer as a seed, and removing an unnecessary silicon by a CMP method.

Conversely, a method of thinning the single crystalline silicon layer includes thermally oxidizing the surface of the single crystalline silicon layer after the step shown in FIG. 7A, thereby oxidizing the exposed surface to thin the oxidized portion of the single crystalline silicon layer. As a further simpler method, the exposed single crystalline silicon layer alone may be thinned by a CDE (Chemical Dry Etching) method and RIE (Reactive Ion Etching) method. If necessary, an oxidation process is performed, thereby reducing an etching damage.

Subsequently, a fifth embodiment will be explained with reference to FIGS. 8A and 8B.

Figure 8A:
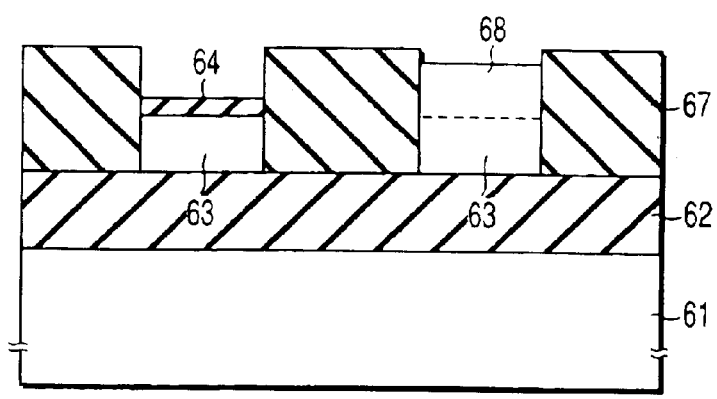
FIGS. 8A and 8B are cross-sectional views of a semiconductor device of the present invention, showing manufacturing steps.
Figure 8B:
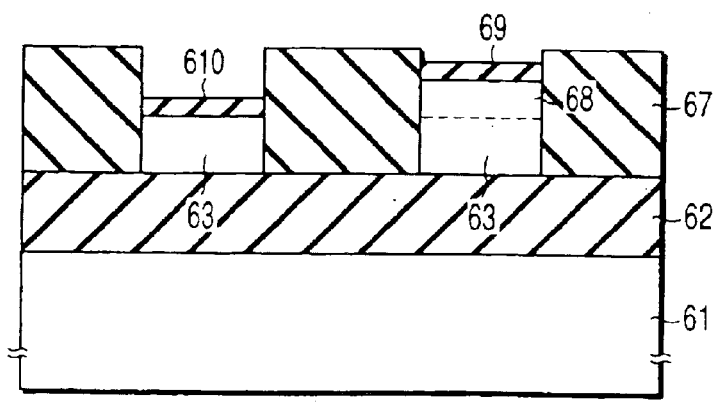

FIGS. 8A and 8B are cross-sectional views showing manufacturing steps of a semiconductor device having a plurality of single crystalline semiconductor layers different in thickness. The semiconductor device of this embodiment is characterized in that the single crystalline semiconductor layers differ in thickness and the gate oxide films formed thereon further differ in thickness.

The method of manufacturing the semiconductor device is the same as in the fourth embodiment up to the step shown in FIG. 7A. After that, a single crystalline silicon layer 68 of about 50 nm thick is selectively deposited on the surface of the single crystalline silicon layer by a LPCVD method. Subsequently, a silicon nitride film 65 is etched with hot phosphoric acid (FIG. 8A). Thereafter, the surface of a single crystalline silicon layer 63 and the surface of a single crystalline silicon layer 68 are oxidized by a thermal oxidation method to a depth of about 4 nm. At this time, on the thick single crystalline silicon layer formed by depositing the single crystalline silicon layer 68 formed on the thick single crystalline silicon layer 63, a gate oxide film 69 such as a silicon oxide film of 4 nm thick is formed. However, on the thin single crystal silicon layer 63 consisting of the single crystal silicon layer 63 alone, a silicon oxide film of 6 nm thick has been formed before the oxidation (see FIG. 8A). Therefore, a gate insulating film 610 formed of a silicon oxide film of about 8 nm thick is formed (FIG. 8B). Thereafter, a polysilicon layer serving as a gate electrode is deposited. It is therefore possible to integrate semiconductor elements each having the single crystalline silicon layer and the gate insulating film different in thickness on the same SOI substrate. The element isolation insulating films in the element isolation region have the same height.

Now, a sixth embodiment will be explained with reference to FIGS. 9A, 9B, and 9C to FIGS. 11A and 11B.

FIGS. 9A, 9B, and 9C and FIGS. 10A and 10B are cross sectional views showing manufacturing steps of a semiconductor device shown in FIG. 3 in which the insulating films in the element isolation region have almost the same thickness even though the semiconductor elements having single crystalline silicon layers different in thickness are formed on the same SOI substrate. The semiconductor device is characterized in that a later wiring layer formation process can be easily performed since the element isolation insulating films have the same height, and in that the gate electrodes have the same height.

The process is the same as shown in FIG. 6A up to the process in which a SOI substrate is prepared by laminating a buried insulating film 82 formed of a silicon oxide film of 500 nm and a single crystalline silicon layer 83 of 50 nm thick, on a silicon semiconductor substrate 81.

Then, the single crystalline silicon layer 83 is subjected to a heat treatment in an oxygen atmosphere at 900° C. to oxidize the surface thereof. As a result, a gate insulating film 84, which is a silicon oxide film of 6 nm thick is formed. Subsequently, a polysilicon film 85 of 50 nm thick and a silicon nitride film (SiN) 86 are successively deposited by a LPCVD. Furthermore, a silicon oxide film ($SiO_2$) 87 of 100 nm thick is deposited by a CVD method on the resultant structure. If necessary, the silicon oxide film 87 is densified to cure by applying a heat treatment.

Figure 9A:
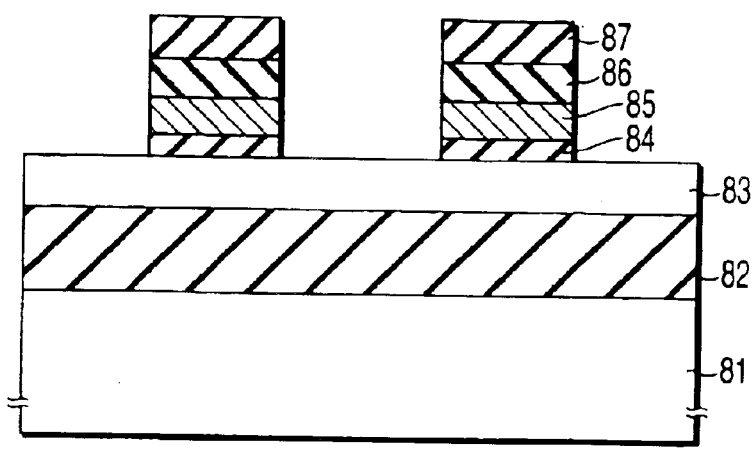
FIGS. 9A, 9B, and 9C are cross-sectional views of a semiconductor device of the present invention, showing manufacturing steps.

Subsequently, a patterned photoresist (not shown), which is designed so as to leave the photoresist only at an element formation region by a photolithographic method, is formed on the silicon oxide film 87. Using the photoresist as a mask, the silicon oxide film 87, silicon nitride film 86, polysilicon film 85, and silicon oxide film 84 are etched away by a RIE method. Thereafter, the photoresist is removed (FIG. 9A).

Figure 9B:
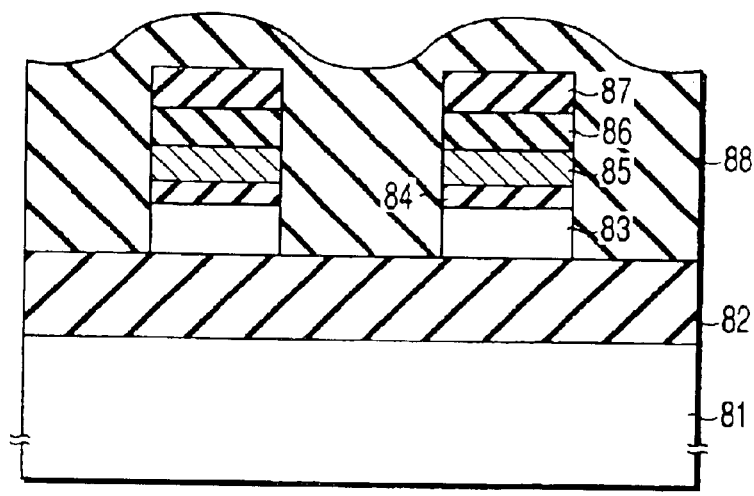
Figure 9C:
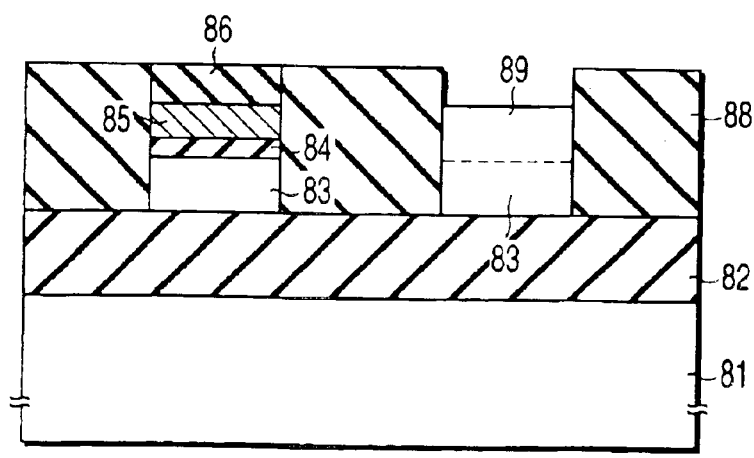

Then, using the silicon oxide film 87 as a mask, the single crystalline silicon layer 83 is etched away by a RIE method. Thereafter, oxidation is applied to the resultant structure (not shown in the figure). Subsequently, a silicon oxide film 88 of 500 nm thick is deposited so as to cover a laminate body consisting of the silicon oxide film 87, the silicon nitride film 86, the polysilicon film 85, and the silicon oxide film 84 (FIG. 9B).

Next, the surface of the silicon oxide film 88 is polished by a CMP method until the surface of the silicon nitride film 86 is exposed, thereby removing the silicon oxide film 87. At this time, the surface of the silicon nitride film 86 is slightly removed. By the polishing process, the silicon oxide film 88 of about 120 $\mu$m thick is formed almost uniformly over the substrate, as an element isolation insulating film, in the element isolation region.

Thereafter, a photoresist (not shown) having an opening only at a region at which the single crystalline layer is to be formed thick, is formed by a photolithographic step on the silicon nitride film 86 and the silicon oxide film 88. Using the photoresist as a mask, the silicon nitride film 86 within an opening is etched away with hot phosphoric acid, the polysilicon film 85 is etched away by a CDE method, the silicon oxide film 84 is etched away with diluted hydrofluoric acid, and further the photoresist is removed. In this manner, the surface of the single crystal silicon layer 83 on which the opening of the photoresist is formed, is exposed.

Figure 10A:
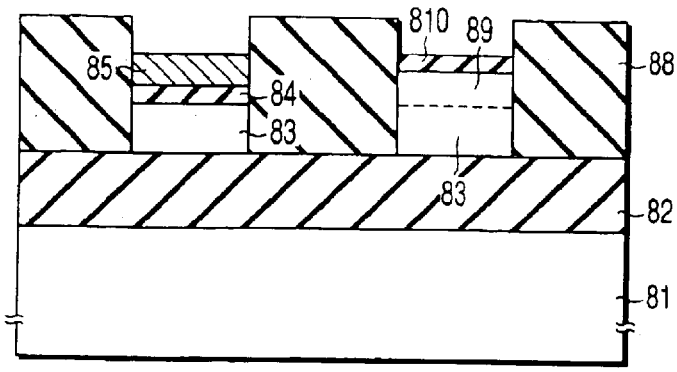
FIGS. 10A and 10B are cross-sectional views of a semiconductor device of the present invention, showing manufacturing steps.

Then, the single crystalline silicon layer 89 of 50 nm thick is selectively deposited by a LPCVD method on the surface of only the exposed single crystalline silicon layer 83. At this time, the height of the polysilicon film 85 has almost the same as that of the single crystalline silicon layer 89. Various methods explained in the fourth embodiment may be used herein. Subsequently, an insulating film 810, which is a silicon oxide film of 4 nm thick, is formed by a thermal oxidation step. Subsequently, a silicon nitride film 86 covering the polysilicon film 85 is etched away with hot phosphoric acid (FIG. 10A).

Subsequently, a polysilicon gate electrode 811 of 100 nm thick is deposited by a LPCVD method. The resultant structure is further subjected to a gate processing to obtain a gate structure shown in FIG. 10B.

Figure 10B:
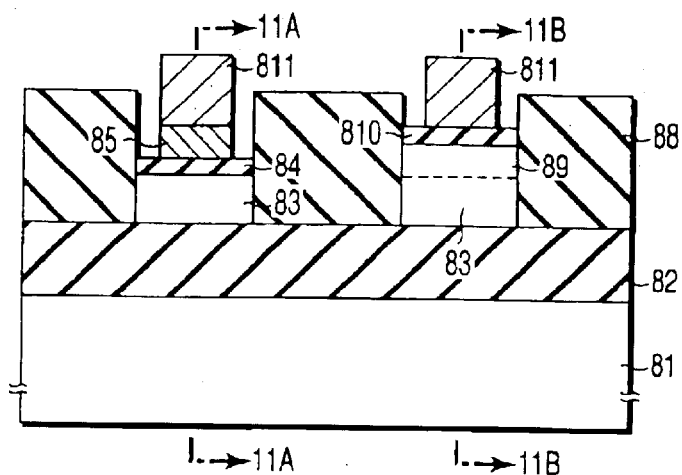
Figure 11A:
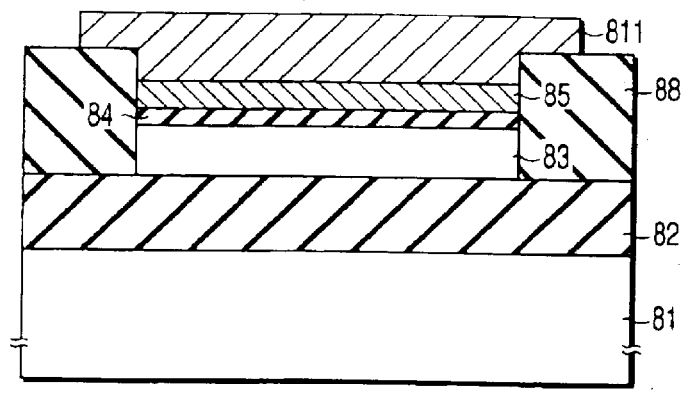
FIGS. 11A and 11B are cross-sectional views taken along the line 11A—11A and 11B—11B of FIG. 10B.
Figure 11B:
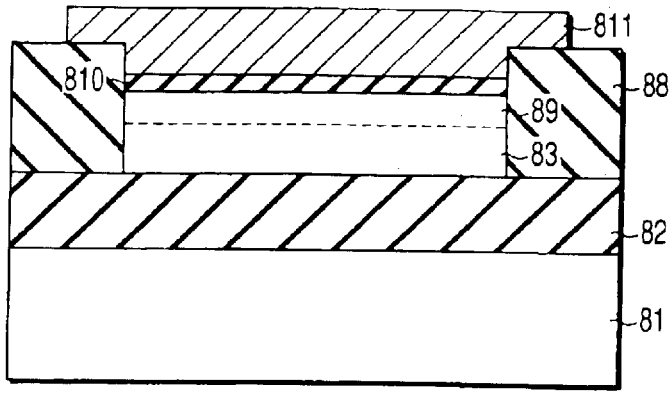

Cross-sectional views of a portion taken along the line 11A—A11 and a portion taken along the line 11B—11B of FIG. 10B are shown in FIGS. 11A and 11B. Although detailed explanation is omitted, the gate electrode of the portion taken along the line 11A—11A is formed of a first gate electrode 85 and a second gate electrode 811 directly mounted on the gate electrode 85. The gate electrode of the portion taken along the line 11B—11B is constituted of the second gate electrode 811 alone. Both gate electrodes have almost the same height from the surface of the semiconductor substrate 81.

As shown in FIG. 10B, it is possible to attain a semiconductor device of the second embodiment having the following advantages: single crystalline silicon layers different in thickness can be formed on the same SOI substrate; the gate electrodes formed on individual single crystalline silicon layers may have the same height from the surface of the substrate; the thickness of gate oxide films on the individual single crystalline silicon layers can be changed independently of each other; and the element isolation insulating films in the element isolation region may have almost the same thickness.

A further simpler method can be employed in order to form the gate electrodes at the same height to prevent the "out-of-focus" in the photolithographic step, improving the yield and reliability of a wiring formation step for wiring to be formed over the gate electrodes. More specifically, the fact that the difference in height of the single crystalline silicon layers affects the difference in height of the polysilicon films from the surface of the substrate becomes apparent for the first time after the structure shown in FIG. 6A is formed, the gate oxidation step is performed, and the polysilicon film is deposited. Therefore, the uneven polysilicon film may be polished flat by a CMP method. In the structure of FIG. 10B, a part of the gate electrode may have a multi-layered polysilicon structure. However, all gate electrodes formed by this method have a single-layered structure. As described, it is possible to control the height of the polysilicon film at the same level by performing CMP. This is because the heights of the insulating films in the element isolation region are equal even though the single crystalline silicon layers differ in thickness. If the heights of the insulating films are not the same, this method is not applicable since a part of the element isolation region is cut off.

Now, a seventh embodiment will be explained with reference to FIGS. 12A, 12B, and 12C and FIGS. 14A and 14B.

FIGS. 12A, 12B, 12C and FIGS. 13A and 13B are cross-sectional views of a semiconductor device having a structure (shown in FIG. 4) consisting of a plurality of single crystalline silicon layers different in thickness and two-layered gate electrodes formed on the single crystalline silicon layers with an insulating film interposed between them.

In the first place, a SOI substrate is prepared by laminating a buried insulating film 92 of a silicon oxide film of 500 nm thick and a single crystalline silicon layer 93 of 50 nm thick on a silicon semiconductor substrate 91. Subsequently, the resultant structure is subjected to a heat treatment at 900° C. to oxidize the surface of the single crystalline silicon layer 93 to form a silicon oxide film 94 of 8 nm thick, followed by subjecting to a nitrification treatment.

Then, a polysilicon film 95 of 50 nm thick and a silicon nitride film 96 of 100 nm thick are successively deposited by a LPCVD method. Furthermore, a silicon oxide film 97 of 100 nm thick is deposited by a CVD method. If necessary, the silicon oxide film 97 is densified to cure by a heat treatment. Thereafter, photoresist (not shown) is formed having an opening portion at an element formation region by a photolithographic method.

Figure 12A:
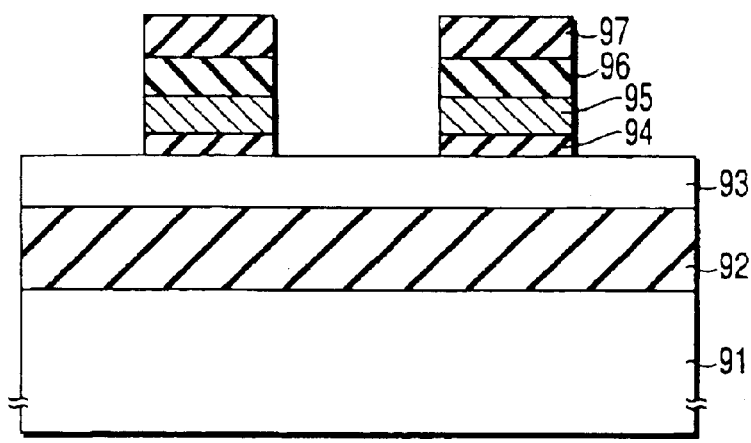
FIGS. 12A, 12B, and 12C are cross-sectional views of a semiconductor device of the present invention, showing manufacturing steps.

Using the photoresist as a mask, the silicon oxide film 97, the silicon nitride film 96, the polysilicon film 95, and the silicon oxide film 94 are etched away by a RIE method. Thereafter, the photoresist is removed (FIG. 12A).

Figure 12B:
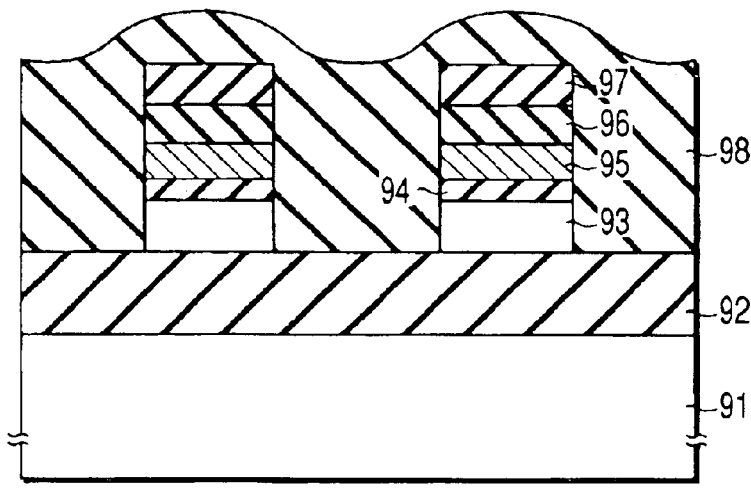

Then, using the silicon oxide film 97 as a mask, the single crystalline silicon layer 93 is etched away by a RIE method. Thereafter, the resultant structure is subjected to an oxidation process (not shown in the figure). Subsequently, a silicon oxide film 98 of 500 nm thick is deposited by a LPCVD method (FIG. 12B). Then, the surface of the silicon oxide films 97, 98 are polished by a CMP method. At that time, the surface of the silicon nitride film 96 is slightly removed. In this way, an element isolation insulating film 98 formed of a silicon insulating film is formed almost uniformly with a thickness of about 120 nm over the entire surface of the silicon substrate.

Figure 12C:
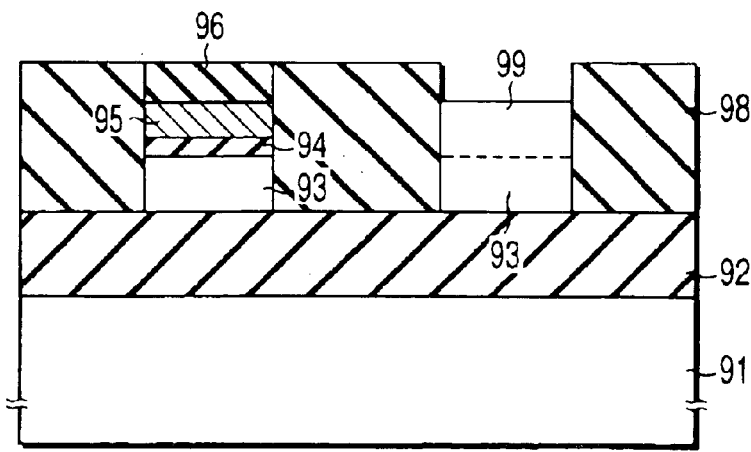

Thereafter, a photoresist is formed having an opening portion which is formed so as to include the region for forming a thick single crystalline silicon layer in a later step. Using the photoresist as a mask, the silicon nitride film 96 is etched away with hot phosphoric acid, the polysilicon film 95 by a CDE method, and the silicon oxide film 94 with diluted hydrofluoric acid. Thereafter, the photoresist is removed to allow the surface of the silicon oxide film 94 to partly expose. Subsequently, a polysilicon layer 99 of about 50 nm thick is selectively formed on only the surface of the single crystalline silicon layer by a LPCVD method (FIG. 12C). At this time, the height of the polysilicon film 95 from the surface of the substrate is almost equal to the height of the polysilicon layer 99 from the surface. Note that various methods explained in the fourth embodiment can be employed herein.

Figure 13A:
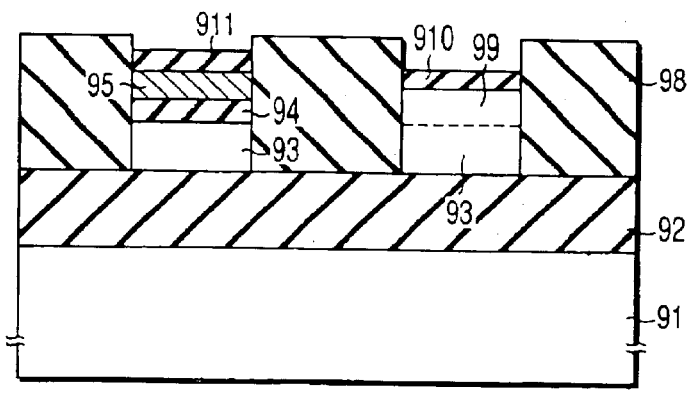
FIGS. 13A and 13B are cross-sectional views of a semiconductor device of the present invention, showing manufacturing steps.

Subsequently, the silicon nitride film 96 is etched away with hot phosphoric acid. Then, an oxide film 910 of 12 nm thick is formed on the silicon oxide film 98 by a thermal oxidation step. At that time, a polysilicon oxide film 911 is formed also on the poly silicon film 95 (FIG. 13A). Thereafter, a polysilicon film 912 of 100 nm thick is deposited by a LPCVD method and gate processing is applied to the resultant structure to thereby obtain a structure of FIG. 13B.

Figure 13B:
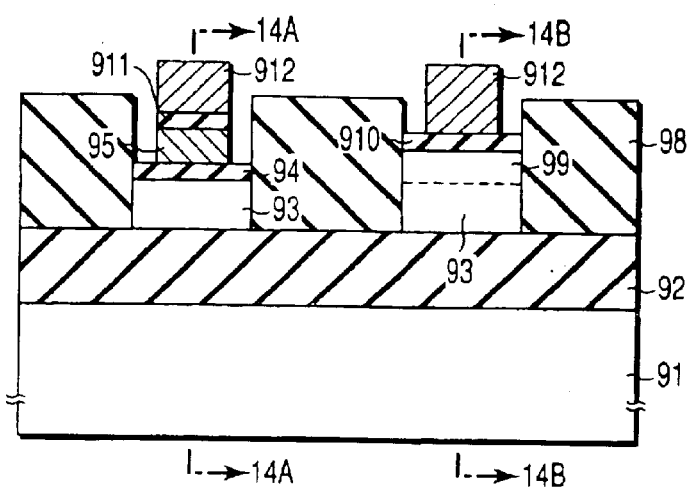
Figure 14A:
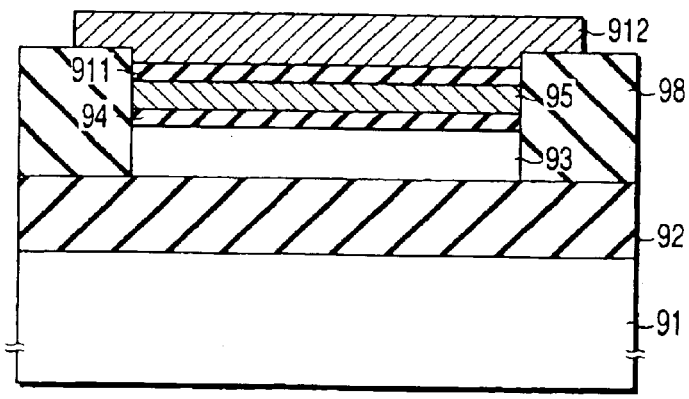
FIGS. 14A and 14B are cross-sectional views of portions taken along the line 14A—14A and 14B—14B of FIG. 13B.
Figure 14B:
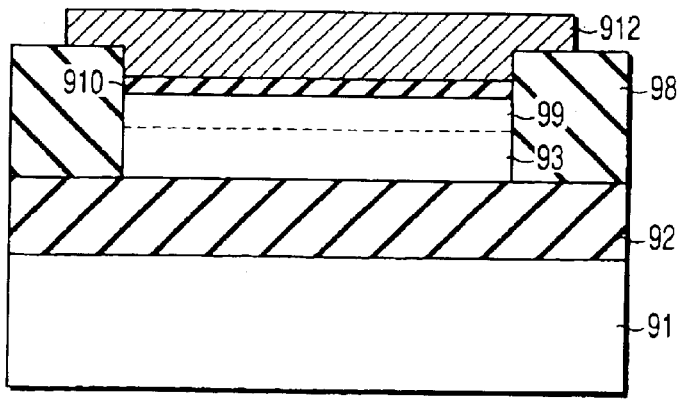

Other cross-sectional views of the structure shown in FIG. 13B are shown in FIGS. 14A and 14B. In FIG. 14A, on the single crystalline silicon layer 93, a tunnel oxide film 94, a floating gate 95, a gate insulating film 911, and a control gate 912 are laminated to form a nonvolatile memory. Furthermore, in FIG. 14B, on the single crystalline silicon layer 99, a gate oxide film 910 and a gate electrode 912 are laminated to form a general logic circuit, which is the same structure as shown in the second embodiment.

As shown in FIG. 10B, single crystalline silicon layers different in thickness are formed on the same SOI substrate; the heights of the gate electrodes from the surface of the substrate are present at the same level; the thickness of the gate oxide film can be changed depending upon the film thickness of each of the single crystalline silicon layers; and the insulating films in the element isolation region have substantially the same thickness; in the same as in the sixth embodiment.

Next, an eight embodiment will be explained with reference to FIGS. 15A and 15B to FIGS. 17A and 17B.

FIGS. 15A and 15B to FIGS. 17A and 17B are cross-sectional views of a semiconductor device shown in FIG. 5 having a plurality of single crystalline semiconductor layers different in thickness. In FIG. 5, the structural features of the present invention are shown which include the buried insulating film, the element isolation insulating film (element isolation region), and the surface of the single crystalline silicon layer on which a semiconductor element is to be formed, whereas other semiconductor structures including the gate electrode and the shape of the impurity diffusion region are not shown.

In the first place, a SOI substrate is prepared which is formed by laminating a buried insulating film 122 of a silicon oxide film of 500 nm thick and a single crystalline silicon layer 123 of 50 nm thick, on a silicon semiconductor substrate 121. Subsequently, a silicon oxide film 124 of 6 nm thick is formed by subjecting the semiconductor substrate to a heat treatment at 900° C. to oxidize the surface of the single crystalline silicon layer 123. Subsequently, the silicon nitride film 125 of about 220 nm thick is deposited by a LPCVD method. Furthermore, a silicon oxide film 126 of 100 nm thick is deposited by a CVD method. If necessary, the silicon oxide film 126 may be densified to cure by applying a heat treatment. Subsequently, the photoresist having an opening portion corresponding to the element formation region, is formed by a photolithographic method.

Using the photoresist as a mask, the silicon oxide film 126, the silicon nitride film 125, and the silicon oxide film 124 are etched away by a RIE method. Thereafter, the photoresist is removed and then the single crystalline silicon layer 123 is etched away by a RIE method using the silicon oxide film 126 as a mask. Thereafter, the oxidation processing is performed (not shown in the figure).

Figure 15A:
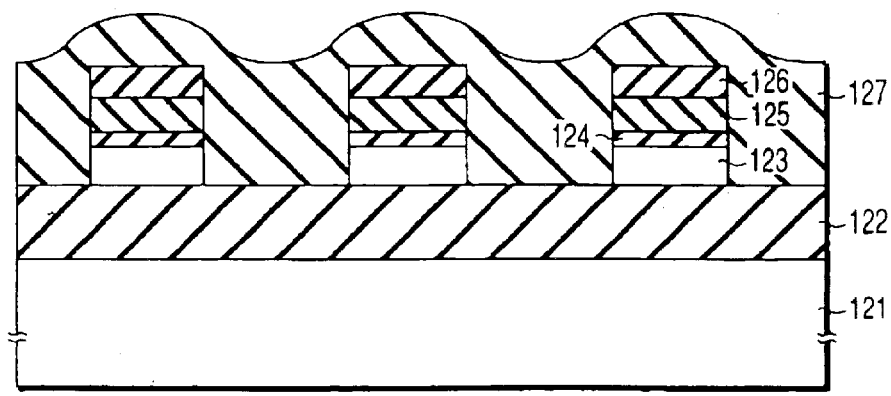
FIGS. 15A and 15B are cross-sectional views of a semiconductor device of the present invention, showing manufacturing steps.
Figure 15B:
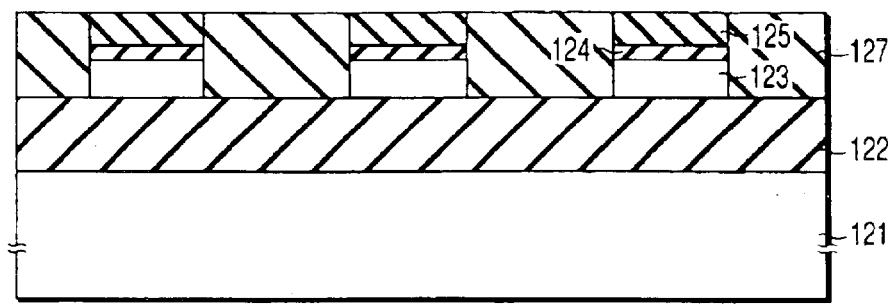

Subsequently, a silicon nitride film 127 of 500 nm thick is deposited so as to cover the silicon oxide film 126, the silicon nitride film 125, and the silicon oxide film 124 (FIG. 15A). Thereafter, the silicon oxide film 126 and the surface portion of the silicon oxide film 127 are removed by a CMP method. At this time, the surface of the silicon nitride film 125 is slightly removed. At this time, in the element isolation region, element isolation insulating film 127 of a silicon oxide film of about 190 nm thick are formed almost uniformly over the entire surface of a silicon wafer (FIG. 15B).

Thereafter, only the silicon oxide film 127 is etched away by a RIE method to the depth of about 70 nm to form a groove. Subsequently, the polysilicon film 128 of about 100 nm thick is deposited by a LPCVD method. Polysilicon except inside the groove is removed by a CMP method. Note that a laminate body of a silicon nitride film and a polysilicon film is used in place of the polysilicon film.

Figure 16A:
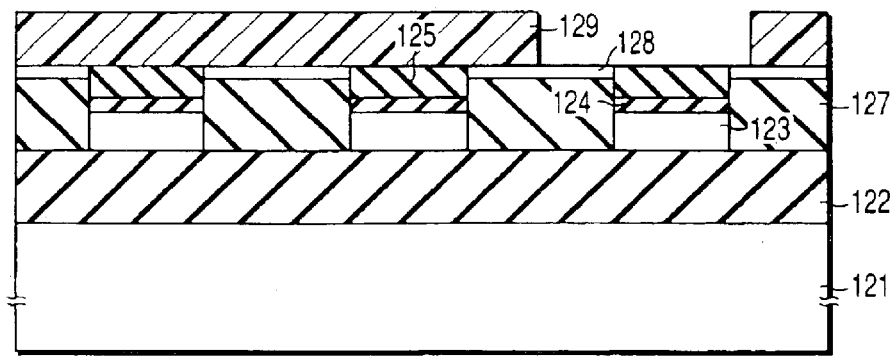
FIGS. 16A and 16B are cross-sectional views of a semiconductor device of the present invention, showing manufacturing steps.
Figure 16B:
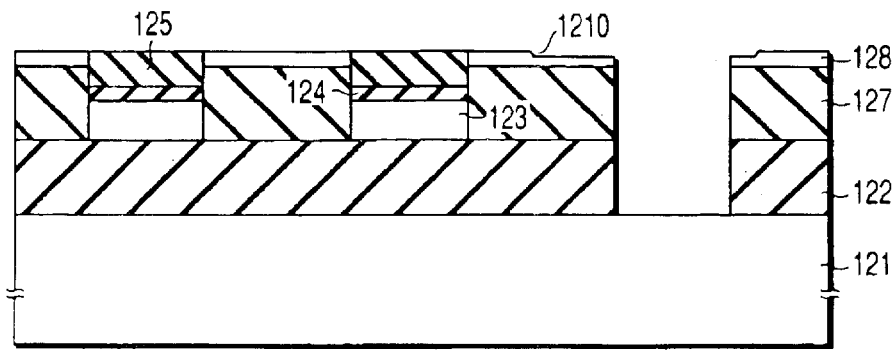

Thereafter, a photoresist 129 is formed having an opening portion surrounding a region in which a bulk semiconductor element is to be formed. Using the photoresist 129 and the polysilicon 128 as a mask, the nitride silicon film 125 is etched away with hot phosphoric acid, the silicon oxide film 124 with a dilute hydrofluoric acid, the single crystalline silicon layer 123 by a RIE method, and a buried insulating film 122 by a RIE method. Subsequently, the photoresist 129 is removed to allow the surface of the silicon semiconductor substrate to partly expose (FIG. 16B). Note that the single crystalline silicon layer 123 has to be carefully etched so as not to completely each away the polysilicon film 128. Thereafter, a photoresist (not shown) having an opening portion which includes a region at which a single crystalline silicon layer to be formed thick, is formed by a photolithographic step. Using the photoresist as a mask, the silicon nitride film 125 is etched away with hot phosphoric acid, and the silicon oxide film 124 with diluted hydrofluoric acid. Thereafter, the photoresist is removed to partially expose the surface of the single crystalline silicon layer 123. Subsequently, an amorphous silicon film 1211 of 1 μm thick is deposited by a LPCVD method (FIG. 17A).

In this case, the recess 1210 in the polysilicon film 128 of FIG. 16B rarely have a negative effect on the later steps. Conversely, since the range of depositing the amorphous silicon film 1211 is enlarged, the coverage with the amorphous silicon film 1211 can be effectively made. The shape of the recess 1210 does not remain as shown later. The amorphous silicon film 1211 can be crystallized into a single crystalline by using a portion in contact with a single crystalline silicon as a seed.

It is difficult for the amorphous silicon film to be converted into a single crystal on the silicon nitride film 125 and the polysilicon film 128 and usually changed into a polysilicon. The portion changed into polysilicon and the polysilicon film 128 such as a thin-film polysilicon used as a mask are simultaneously removed by a CMP method and then the single-crystalline portions 1213 and 1214 are flattened. The remaining nitride silicon film 125 is etched away with hot phosphoric acid and the silicon oxide film 124 with diluted hydrofluoric acid. As a result, the structure of the SOI substrate shown in FIG. 17B can be obtained. This structure is the same as that shown in FIG. 5.

In this embodiment, the silicon surface of the bulk semiconductor element is lifted up to the level of the element isolation insulating film by depositing amorphous silicon, forming into a single crystal and applying CMP thereto. However, similar effects can be obtained if a selective epitaxial deposition technique is used. In this case, the height of the silicon layer in a bulk semiconductor element region is lower than that of the element isolation insulating film. However, compared to the case where the surface of the silicon layer is not lifted up, the "out-of-focus" of the photolithographic step can be improved and the yield and reliability of the wiring formation step (forming wiring above) can be greatly improved. In addition, the steps can be simplified.

When only the same thickness of the single crystalline semiconductor layers is required as the single crystalline semiconductor layers, an amorphous silicon is deposited on the structure shown in FIG. 16B and allowed to change into a single-crystalline structure.

The semiconductors explained in the aforementioned embodiments are those in which semiconductor elements having a plurality of single crystalline semiconductor layers (SOI-Si layer) different in thickness are integrated and the element isolation insulating films having substantially the same height. In the following embodiments, a semiconductor and a method of manufacturing the semiconductor will be explained which is characterized in that a single crystalline semiconductor layer having a MOS transistor formed therein has substantially the same height from the surface of the semiconductor substrate as that of a single crystalline semiconductor layer having a bipolar transistor from the surface.

Now, a ninth embodiment will be explained with reference to FIG. 18.

FIG. 18 is a cross-sectional view of a silicon semiconductor which has a region having a MOS transistor formed therein and a region having a bipolar transistor formed therein. On a silicon semiconductor substrate (SOI substrate) 131, a buried insulating film 132, which is a silicon oxide film of about 500 nm thick, is deposited. On the resultant structure, a plurality of element regions are formed while being isolated by element isolation insulating films 133. In the element region, single crystalline silicon layers 134, 1311 are formed. The single crystalline silicon layers 134, 1311 have a film thickness of 100 nm. On the single crystalline silicon layer 134, a gate electrode 136 of impurity-doped polysilicon is formed with a gate oxide film 135 of 6 nm thick interposed between them. The gate electrode 136 is covered with a silicon nitride (SiN) film 137. At the sides of the gate electrode 136 and the silicon nitride film 137, a gate side wall 138 is formed of a silicon oxide film, silicon nitride film, or a laminated film consisting of the silicon nitride film and the silicon oxide film. A large amount of impurities are doped into both sides of the gate side wall 138. A single crystalline silicon semiconductor layer 139 is formed higher than the gate oxide film 135, that is, about 100 nm thick on the single crystalline silicon semiconductor layer 134. The single crystalline silicon semiconductor layer 139 forms a source/drain region of an MOS transistor. The source/drain region is formed also in the single crystalline silicon layer 134.

On the other hand, in the single crystalline silicon layer 1311 of 100 nm thick, a collector region of a bipolar transistor doped with a large amount of n-type impurities, is formed. On the single crystalline silicon layer 1311, a single crystalline silicon semiconductor layer 1312 of e.g., about 100 nm thick is formed. The single crystalline silicon layer 1312 is doped with a p-type impurity to form a base region of the bipolar transistor. On the uppermost surface of the deposited single crystalline silicon semiconductor layer 1312, an emitter region 1313 of a bipolar transistor doped with a n-type impurity is formed. An emitter electrode is not shown in the figure. On the single crystalline silicon semiconductor layer 1312, an insulating film 1315 made of a silicon oxide is formed for electrically isolating a base electrode 1314 of polysilicon and an emitter electrode 1316 from each other. The MOS transistor and the bipolar transistor are covered with an insulating film 1317 such as silicon oxide film. On the insulating film 1317, a metal wiring 1318 of a predetermined pattern is formed.

The metal wiring 1318 is connected to a source/drain region and a base electrode through a contact hole 1319 formed in the insulating film 1317.

The miniaturized MOS transistor shown in FIG. 18 generally employs an LDD structure. Detailed structures of the gate side wall insulating material and impurity diffusion region are omitted. As the gate electrode structure, various structures including a gate electrode having a polysilicon/metal (silicide) on which a further insulating film is deposited or a gate electrode formed of a metal, can be employed. However, the explanation of these structures is omitted herein. Furthermore, an impurity structure such as a well structure in the silicon substrate is not shown.

The aforementioned explanation is the same with respect to the following figures.

The feature of the present invention resides in the following points. Although the semiconductor elements having single crystalline silicon semiconductor layers different in thickness are formed on the same SOI substrate, the insulating films in the element isolation region have almost the same thickness. Furthermore, since the single crystalline silicon semiconductor layers having different types of elements such as a MOS transistor and a bipolar transistor have the same height from the surface, processing can be performed much easier when a wiring layer is formed in a later step.

Now, referring to FIG. 19A to FIG. 21B, how to manufacture the SOI-Si layer on a silicon semiconductor substrate according to the method of a tenth embodiment of the present invention, will be explained.

Figure 19A:
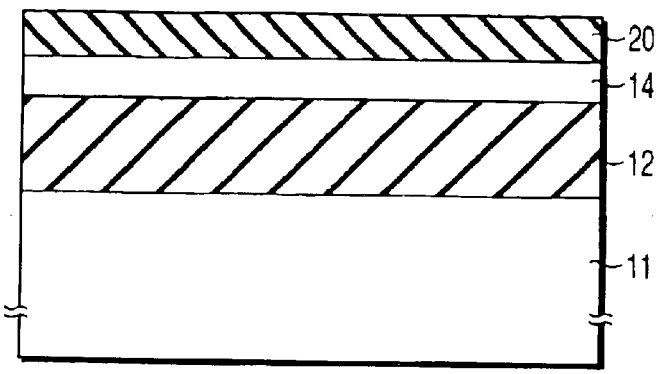
FIGS. 19A, 19B, and 19C are cross-sectional views of a semiconductor device of the present invention, showing manufacturing steps.
Figure 19B:
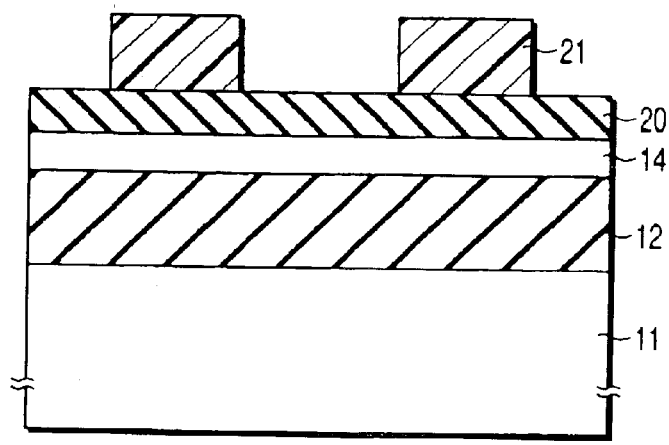
Figure 19C:
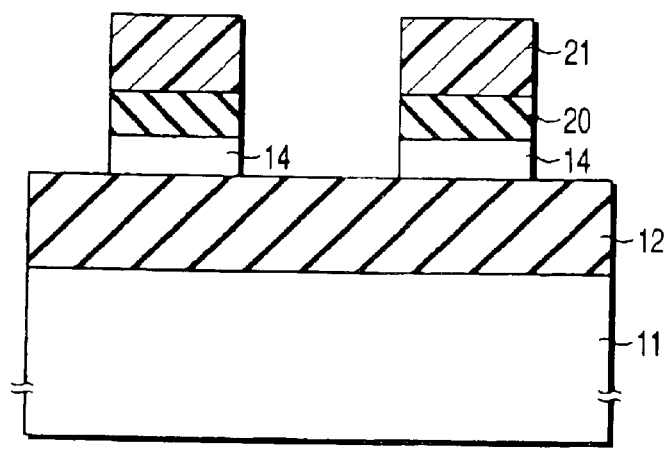

A semiconductor substrate (hereinafter, referred to as SOI (silion on insulator) substrate) 11 is prepared which is formed by laminating a buried oxide film 12 such as a silicon oxide film and a single crystalline silicon film (SOI-Si film) 14 in this order on the surface thereof. On the SOI substrate 11, a first insulating film 20 such as a silicon oxide or silicon nitride is deposited (FIG. 19A). Subsequently, a photoresist 21 is deposited on the first insulating film 20. The photoresist 21 is patterned by lithography so as to remove the photoresist 21 in a field region while leaving the photoresist 21 in the element formation region, thereby forming a resist pattern 21 in the element formation region (FIG. 19B). Using the photoresist pattern 21 as a mask, etching is performed in accordance with anisotopic etching such as RIE (Reactive Ion Etching) to remove the first insulating film 20 and the single crystalline silicon film 14 in the element isolating region (FIG. 19C).

Figure 20A:
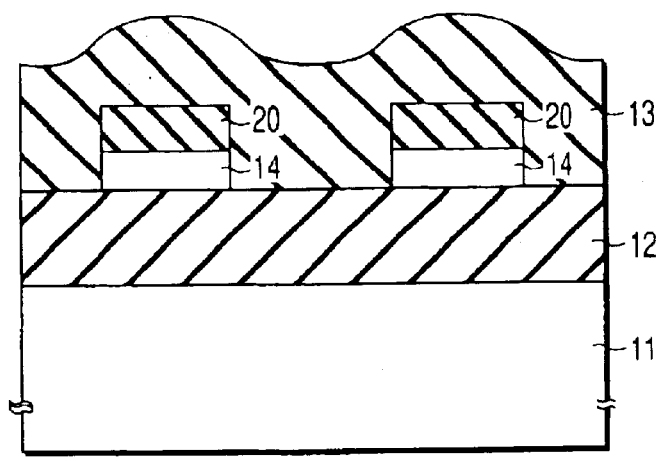
FIGS. 20A, 20B, and 20C are cross-sectional views of a semiconductor device of the present invention, showing manufacturing steps.
Figure 20B:
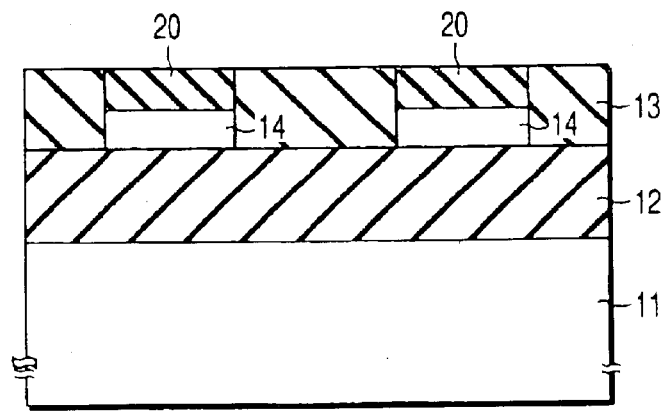
Figure 20C:
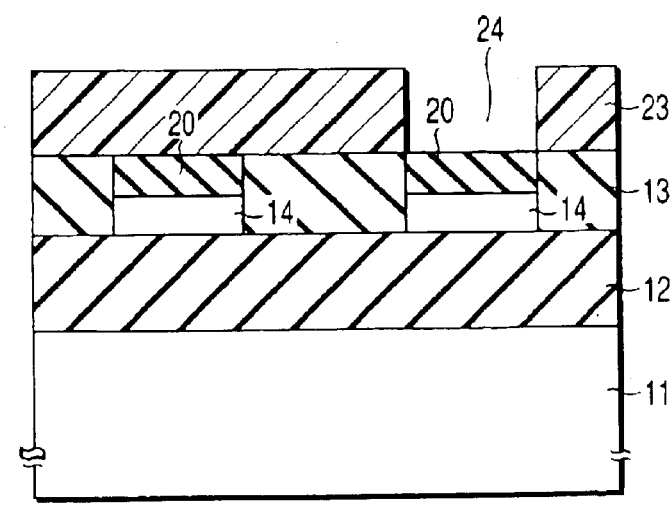
Figure 21A:
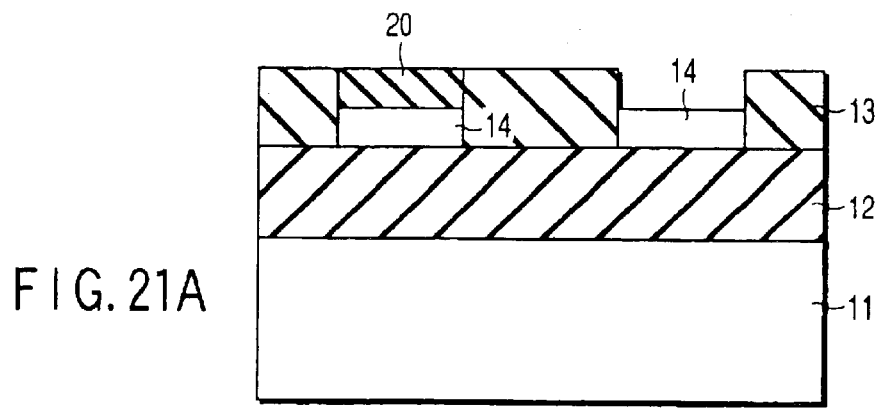
FIGS. 21A and 21B are cross-sectional views of a semiconductor device of the present invention, showing manufacturing steps.

Subsequently, the photoresist 21 is removed and then a second insulating film 13 formed of a silicon oxide is deposited on the first insulating film 20 and the element isolating region (FIG. 20A). Then, the second insulating film 13 is polished by CMP (Chemical Mechanical Polishing) until the height of the insulating film 13 from the surface of the substrate becomes equal to that of the first insulating film 20 (FIG. 20B). In this manner, a buried element isolation insulating film 13 consisting of the second insulating film 13 is formed in the element isolating region. Then, the same plane consisting of the first insulating film and the element isolation insulating film is coated with a photoresist 23 and subjected to patterning. As a result, a window (photoresist window) 24 is formed on the element region on which a thick single crystalline silicon film is designed to be formed (FIG. 20C). Subsequently, etching is performed through the window 24 to remove the first insulating film 20 in the window to expose the single crystalline silicon film 14. Thereafter, the photoresist is removed (FIG. 21A). In the etching process, it is preferable that an etching agent or an etching method not etching away the element isolation insulating film 13 should be selected. Thereafter, single crystalline silicon is deposited in accordance with a selective epitaxial deposition method on the single crystalline silicon film 14 exposed within the photoresist opening portion (window) 24. As a result, a single crystalline silicon film 15 is formed on the single silicon film 14. The single crystalline silicon film 15 is thicker than the single crystalline silicon film 14 formed in the element region masked (covered) with the first insulating film 20.

Figure 21B:
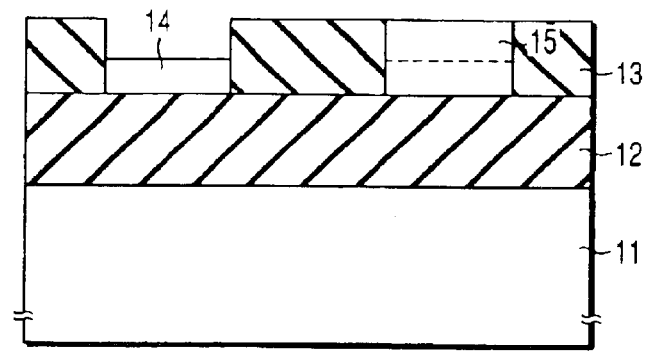

Thereafter, the first insulating film 20 is etched away (FIG. 21B). Then, the next step for forming a transistor in the single crystalline silicon films 14, 15 is started.

In this way, a plurality of element isolating films 13 are formed which have the same height from the semiconductor substrate 11, and simultaneously, a plurality of element regions having single crystalline silicon films (SOI-Si layer) different in film thickness.

The thick single crystalline silicon film is formed by a selective epitaxial growth method as shown in the above. Alternatively, the thick single crystal silicon film may be formed by depositing an amorphous silicon film, subjecting it to a heat processing to allow epitaxial growth of the amorphous silicon film, and removing an unnecessary portion by CMP.

The window may be formed on the single crystalline silicon film of the element region to which a thin single crystal silicon film is to be formed. In this case, the single crystalline silicon film of the element region, to which a thin single crystalline silicon film is to be formed, is reduced in thickness in a later step. More specifically, the window 24 is formed on the element region to which a thick single crystalline silicon film is designed to be formed in the aforementioned method. Conversely, the window is formed on the single crystalline silicon film of the element region to which a thin single crystal silicon film is to be formed. In this case, the first insulating film 20 of the element region to which a thin single crystalline silicon film is to be formed, is removed to expose the surface of the single crystalline silicon film 14, and the element region is oxidized, thereby reducing the single crystalline silicon film.

In the aforementioned method, when the photoresist window 24 is formed on the element region to which the single crystalline silicon film (SOI-Si layer) is formed thick, a photoresist film window is formed in the bulk formation region, and then, the buried oxide film (BOX) is etched away. In the etched portion, a bulk element such as a bipolar transistor is formed. In this manner, the SOI element and the bulk element can be integrally formed.

Now, an eleventh embodiment will be explained with reference to FIGS. 22A and 22B.

Figure 22A:
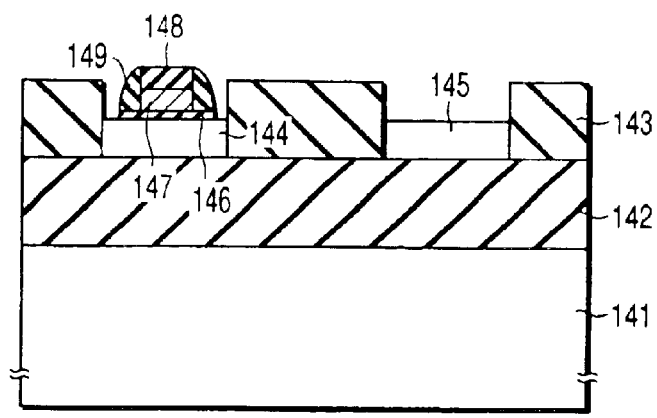
FIGS. 22A and 22B are cross-sectional views of a semiconductor device of the present invention, showing manufacturing steps.
Figure 22B:
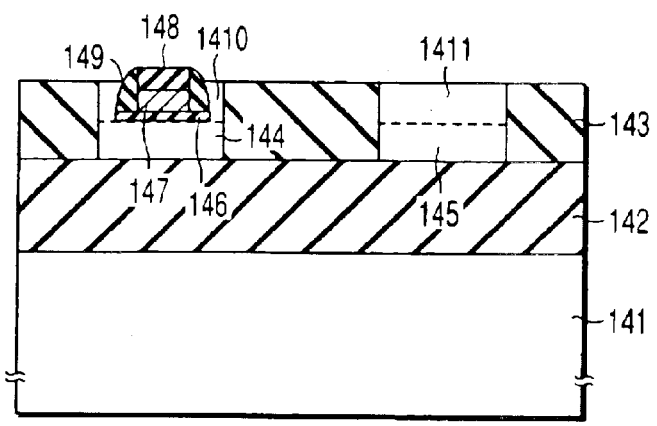

FIGS. 22A and 22B, which are cross-sectional views of manufacturing step of a semiconductor device, show a manufacturing step of the semiconductor device shown in FIG. 18.

In the first place, a SOI substrate is prepared in which a laminate film consisting of a buried insulating film 142 of a silicon oxide film of 500 nm thick and a single crystalline silicon layer of 100 nm thick, is formed on a wafer-form silicon semiconductor substrate 141. The resultant structure is subjected to an oxidation process at 900° C. to form a silicon oxide film of 6 nm thick. Thereafter, a silicon nitride film (SiN) of about 250 nm thick is deposited by a LPCVD method. Furthermore, a silicon oxide film of 100 nm thick is deposited by a CVD method. If necessary, the silicon oxide film is densified to cure by applying a heat treatment. A photoresist is allowed to remain in the element formation region by a photolithographic method. Using the photoresist as a mask, the silicon oxide film, SiN film, and silicon oxide film are etched away. Thereafter, the photoresist is removed. Then, using the silicon oxide film as a mask, the single crystalline silicon layer is etched away by a RIE method. After that, the surface oxidation process is performed. Subsequently, the silicon oxide film of 500 nm thick is deposited by a LPCD method.

Thereafter, the surface of the silicon oxide film is removed by a CMP method. At this time, the surface of the SiN film is slightly removed. At this time, in the element isolation region, an element isolation insulating film 143 of the silicon oxide film of about 220 nm thick is uniformly formed over the entire surface of the buried insulating film of the semiconductor substrate 141. Thereafter, the SiN film is etched away with hot phosphoric acid and the silicon oxide film with a dilute hydrofluoric acid to expose the surfaces of the single crystalline silicon layers 144, 145. A MOS transistor is formed on the single crystalline silicon layer 144 and a bipolar transistor is formed on the single crystalline silicon layer 145.

Thereafter, a gate insulating film 146 of 6 nm thick is formed and polysilicon is deposited with a thickness of 60 nm, and furthermore a silicon nitride film of 60 nm thick is deposited. Then, a photoresist is formed only on a portion at which a gate electrode of the MOS transistor to be formed by a photolithographic step. A gate electrode 147 formed of a silicon nitride (SiN) film 148 and a polysilicon film is left as a gate pattern by a RIE method. At this time, a gate pattern is not formed in the single crystalline silicon layer 145 to which the bipolar transistor is to be formed. Subsequently, the silicon oxide film or the silicon nitride film is deposited with a thickness of about 20 nm by a CVD method and RIE is applied to the entire surface. In this way, the side-wall insulating film 149 is left only at the gate side wall portion.

At that time, a thermal oxidation film of about 4 nm thick remains on the portion excluding the gate portion on the single crystal silicon semiconductor layer 144 and on the single crystalline silicon semiconductor layer 145. Subsequently, the photoresist is removed by doping an n-type impurity into the region of the single crystalline silicon semiconductor layer 145 in a photolithographic step and an ion-doping step, and then, thermal processing for activation is performed to remove the remaining thermal oxidation film of about 4 nm thick (FIG. 22A). Thereafter, the single crystalline silicon layers 1410, 1411 are selectively deposited on the silicon surface with a thickness of about 100 nm by an LPCVD method (FIG. 22B).

As a method of forming the single crystal silicon layer can be modified in various ways. In the aforementioned embodiment, the single crystalline silicon layer is obtained with a predetermined thickness by a selective silicon epitaxial growth technique. In this case, after the silicon is overfilled by the selective silicon epitaxial growth to the thickness higher than that of element isolation silicon oxide film 143, an unnecessary portion of the silicon may be removed by a CMP technique. Almost the same structure is resulted. Advantages of this method reside in that it is easy to control the thickness of silicon and in that a problem of facet which tends to be generated by the epitaxial growth can be overcome. In addition, the height of the upper portion of the gate electrode can be made equal to the height of the element isolation region.

There is another method having the same advantage as the aforementioned method. In this method, amorphous silicon is deposited over the entire surface, and annealing is made by using the portion in contact with the single crystalline silicon layer as a seed. Solid-phase growth is made in this manner and then an unnecessary portion is removed by a CMP method. Thereafter, an n-type impurity diffusion region is formed in the region of the single crystalline silicon layer 1410 and a p-type impurity diffusion region is formed in the single crystalline silicon layer 1411, and then, a base electrode made of polysilicon is formed. Subsequently, an electrically isolated emitter doped with an n-type impurity is formed and subsequently an emitter electrode is formed on a silicon semiconductor substrate 1411. Thereafter, the wiring step is performed to form wiring (See FIG. 18).

Figure 23:
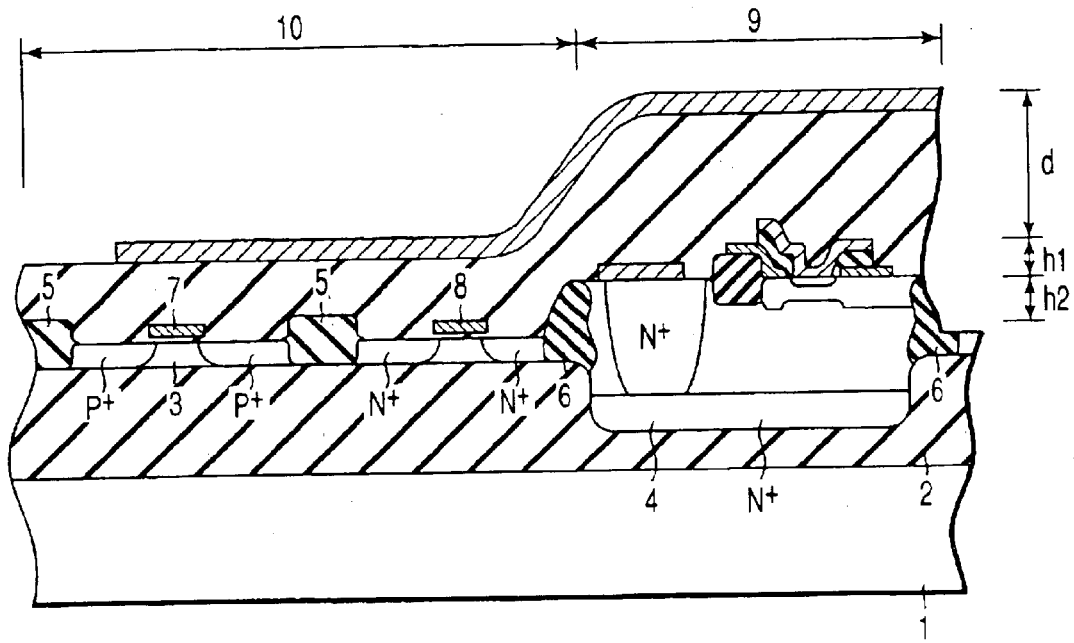
FIG. 23 are cross-sectional views of a conventional semiconductor device, showing manufacturing steps.

In FIG. 22A, the single crystalline silicon layers different in thickness are formed on the same SOI substrates. The insulating films in the element isolation region have almost the same thickness. In these respects, the semiconductor device of the present invention can be realized. Furthermore, since processing is made so as to form the surfaces of the single crystalline silicon layers appropriately at the same height, a contact hole can be formed by a simple processing. In the step of forming a wiring structure, there are a larger stepped portion d of wiring between the MOS transistor region 10 and the bipolar transistor region 11 in the conventional semiconductor device shown in FIG. 23.

The stepped portion d is due to the height h1 of an extension electrode of a bipolar transistor and the difference h2 in height between the element isolation insulating film 6 of the bipolar transistor region 9 and the element isolation insulating film 5 of the MOS transistor region 10 (d=h1+h2).

Figure 24:
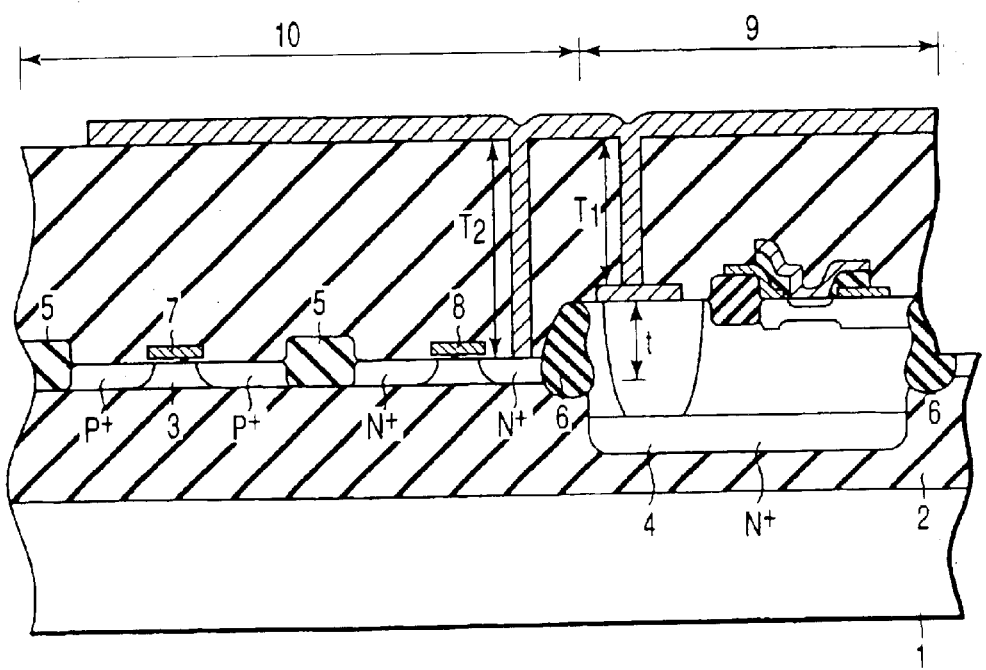
FIG. 24 are cross-sectional views of a conventional semiconductor device, showing manufacturing steps.

If the stepped portion is too large, the lithography is not accurately performed and the coverage with the insulating film is not sufficient. On the other hand, there is no stepped portion in the cross-sectional view of a conventional semiconductor device shown in FIG. 24, so that the surface is flat. However, there is a large difference in depth (T2−T1) between a contact hole in which connecting wiring for electrically connecting the wiring to the source/drain region of a MOS transistor is buried and a contact hole in which connecting wiring for electrically connecting between the wiring and base electrodes of the bipolar transistor. It is therefore difficult to form the contact hole by etching and metal coverage is not sufficient. The connecting wiring is not sufficiently deposited in a deep contact hole, frequently causing a wire breakage.

In contrast, in the present invention, there is a stepped portion "d" which is the same as the thickness t of the base electrode, as shown in FIG. 18. Therefore, the out-of-focus rarely occurs in a lithographic step. In addition, it is easy to form contact holes by etching. Micro-processing can be performed without difficulties.

Since the present invention has the aforementioned structures, the following functional effects can be obtained.

Wire-processing is easily performed since the element isolation insulating films are formed at the same height. Therefore, the yield and reliability are improved. Since a wide focus margin is formed by the photolithography applied to the element isolation insulating film, micro processing can be easily made.

It is possible to form different circuits by using elements different in design policy with the most desirable element structures. The different IPs are integrated in the same SOI substrate to improve the performance of a semiconductor device.

It is easy to design a circuit when the circuits operated at power source voltages of two types or more are integrated in the same SOI substrate.

It is possible to attain a circuit different in threshold value and cut-off property without increasing the number of process steps.

It is possible to integrate a plurality of types of desirable semiconductor elements on the same SOI substrate.

It is possible to reduce the number of process steps.

As described, according to the present invention, since the heights of the element isolation insulating films are almost the same, the wiring processing can be easily performed, improving the yield and reliability. Since a focus margin can be formed wide by the photolithography applied to the element isolation insulating film, the micro processing can be performed easily. Since the surfaces of the single crystalline silicon layers are formed at the same height, the contact holes can be formed easily.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate having a first region and a second region;
   a buried insulating film formed in the first region of the semiconductor substrate;
   a plurality of first single crystalline semiconductor layers formed on the buried insulating film;
   at least one second single crystalline semiconductor layer formed in the second region and in contact with the semiconductor substrate;
   a plurality of element isolation regions which insulate at least one of the first single crystalline semiconductor layers from the second single crystalline semiconductor layer, and insulate the first single crystalline semiconductor layers from each other; and
   element isolation insulating films in the element isolation regions having the same height from the semiconductor substrate, and
   wherein the first single crystalline semiconductor layers have different thickness from one another.

2. The semiconductor device according to claim 1, wherein a CMOS element is formed in the first region and a bipolar element is formed in the second region.

3. The semiconductor device according to claim 1, wherein a MOS transistor is formed in one of the first single crystalline semiconductor layers of the first region; a bipolar transistor is formed in one of the at least one second single crystalline semiconductor layers of the second region; the first and second single crystalline semiconductor layers have substantially the same height from the surface of the semiconductor substrate; and the thickness of the semiconductor layer lower than a gate electrode of the MOS transistor is substantially the same as the thickness of the at least one second single crystalline semiconductor layer.

4. The semiconductor device according to claim 2, wherein a MOS transistor is formed in one of the first single crystalline semiconductor layers of the first region; a bipolar transistor is formed in one of the at least one second single crystalline semiconductor layers of the second region; the first and second single crystalline semiconductor layers have substantially the same height from the surface of the semiconductor substrate; and the thickness of the semiconductor layer lower than a gate electrode of the MOS transistor is substantially the same as the thickness of the at least one second single crystalline semiconductor layer.

* * * * *